United States Patent
Harrington, III et al.

(10) Patent No.: US 10,580,884 B2
(45) Date of Patent: Mar. 3, 2020

(54) SUPER JUNCTION MOS BIPOLAR TRANSISTOR HAVING DRAIN GAPS

(71) Applicant: D3 Semiconductor LLC, Addison, TX (US)

(72) Inventors: Thomas E. Harrington, III, Carrollton, TX (US); Zhijun Qu, Frisco, TX (US)

(73) Assignee: D3 Semiconductor LLC, Addison, TX (US)

( * ) Notice: Subject to any disclaimer, the term of this patent is extended or adjusted under 35 U.S.C. 154(b) by 0 days.

(21) Appl. No.: 15/912,400

(22) Filed: Mar. 5, 2018

(65) Prior Publication Data

US 2018/0261691 A1    Sep. 13, 2018

Related U.S. Application Data

(60) Provisional application No. 62/468,726, filed on Mar. 8, 2017.

(51) Int. Cl.

| | | |
|---|---|---|
| *H01L 29/73* | (2006.01) | |
| *H01L 29/06* | (2006.01) | |
| *H01L 29/08* | (2006.01) | |
| *H01L 29/66* | (2006.01) | |
| *H01L 29/78* | (2006.01) | |
| *H01L 39/22* | (2006.01) | |
| *H01L 39/14* | (2006.01) | |
| *H01L 29/739* | (2006.01) | |
| *H01L 21/02* | (2006.01) | |

(52) U.S. Cl.
CPC .... *H01L 29/7396* (2013.01); *H01L 21/02016* (2013.01); *H01L 29/0619* (2013.01); *H01L 29/0634* (2013.01); *H01L 29/0696* (2013.01); *H01L 29/0834* (2013.01); *H01L 29/66333* (2013.01); *H01L 29/7395* (2013.01); *H01L 29/7802* (2013.01); *H01L 39/145* (2013.01); *H01L 39/228* (2013.01)

(58) Field of Classification Search
CPC ............. H01L 29/7396; H01L 29/0619; H01L 29/0634; H01L 29/0696; H01L 29/0834; H01L 29/66333; H01L 29/7395; H01L 29/7802; H01L 39/228; H01L 39/145
See application file for complete search history.

(56) References Cited

U.S. PATENT DOCUMENTS

| | | | | |
|---|---|---|---|---|
| 6,677,643 B2* | 1/2004 | Iwamoto | ........... | H01L 21/26513 257/341 |
| 6,787,420 B2* | 9/2004 | Miyasaka | ........... | H01L 29/0634 438/268 |
| 8,786,015 B2* | 7/2014 | Tamura | ............... | H01L 29/7815 257/339 |
| 8,975,136 B2 | 3/2015 | Willmeroth et al. | | |
| 9,306,045 B2 | 4/2016 | Hsu et al. | | |
| 9,431,249 B2* | 8/2016 | Pattanayak | ........... | H01L 21/266 |
| 9,653,540 B2* | 5/2017 | Weber | ................. | H01L 29/0634 |

(Continued)

*Primary Examiner* — Ida M Soward
(74) *Attorney, Agent, or Firm* — Schultz & Associates, P.C.

(57) ABSTRACT

Methods and designs are provided for a vertical power semiconductor switch having an IGBT-with-built-in-diode bottom-side structure combined with a SJMOS topside structure in such a way as to provide fast switching with low switching losses (MOSFET), low on-resistance at low currents (SJMOS), low on-resistance at high currents (IGBT), and high current-density capability (IGBT).

16 Claims, 23 Drawing Sheets

(56) References Cited

U.S. PATENT DOCUMENTS

| | | | |
|---|---|---|---|
| 9,653,595 B2* | 5/2017 | Niimura | H01L 29/7827 |
| 9,917,181 B2* | 3/2018 | Pfirsch | H01L 29/7397 |
| 9,954,056 B2* | 4/2018 | Hirler | H01L 27/0823 |
| 10,002,920 B1* | 6/2018 | Bolotnikov | H01L 29/0634 |
| 10,074,735 B2* | 9/2018 | Harrington, III | H01L 27/0635 |
| 2005/0098826 A1* | 5/2005 | Yamaguchi | H01L 29/0634 |
| | | | 257/341 |
| 2008/0246084 A1* | 10/2008 | Ono | H01L 29/0634 |
| | | | 257/341 |
| 2012/0068298 A1* | 3/2012 | Miyajima | H01L 29/0634 |
| | | | 257/487 |
| 2014/0175593 A1* | 6/2014 | Schulze | H01L 29/0619 |
| | | | 257/494 |
| 2014/0284715 A1* | 9/2014 | Fukuda | H01L 29/66712 |
| | | | 257/339 |
| 2014/0287559 A1* | 9/2014 | Nakajima | H01L 29/7395 |
| | | | 438/138 |
| 2014/0306283 A1* | 10/2014 | Nakajima | H01L 29/7827 |
| | | | 257/329 |
| 2016/0111419 A1 | 4/2016 | Naito et al. | |
| 2017/0200784 A1* | 7/2017 | Shirakawa | H01L 21/2252 |
| 2018/0158937 A1* | 6/2018 | Pfirsch | H01L 29/7397 |

\* cited by examiner

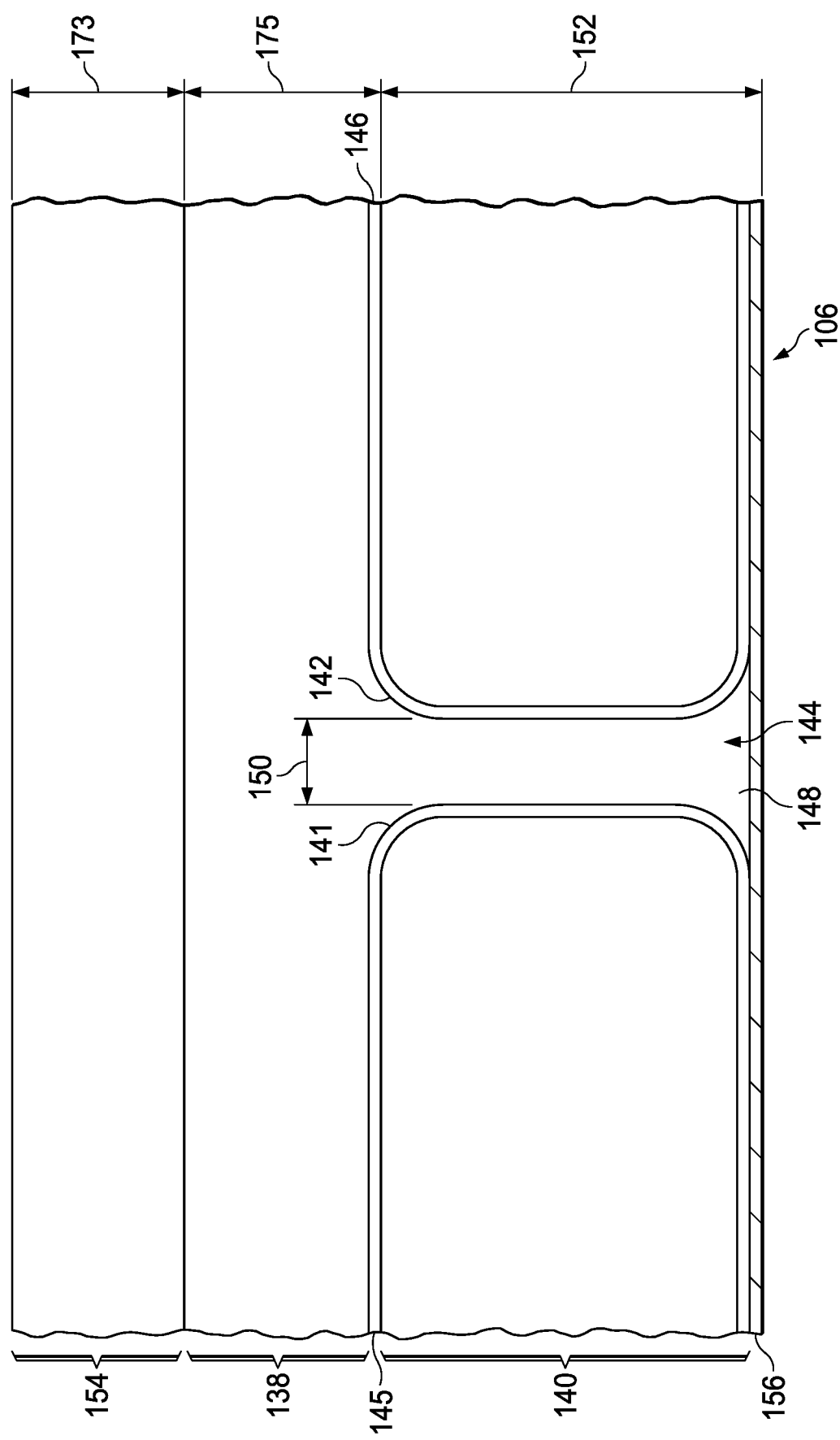

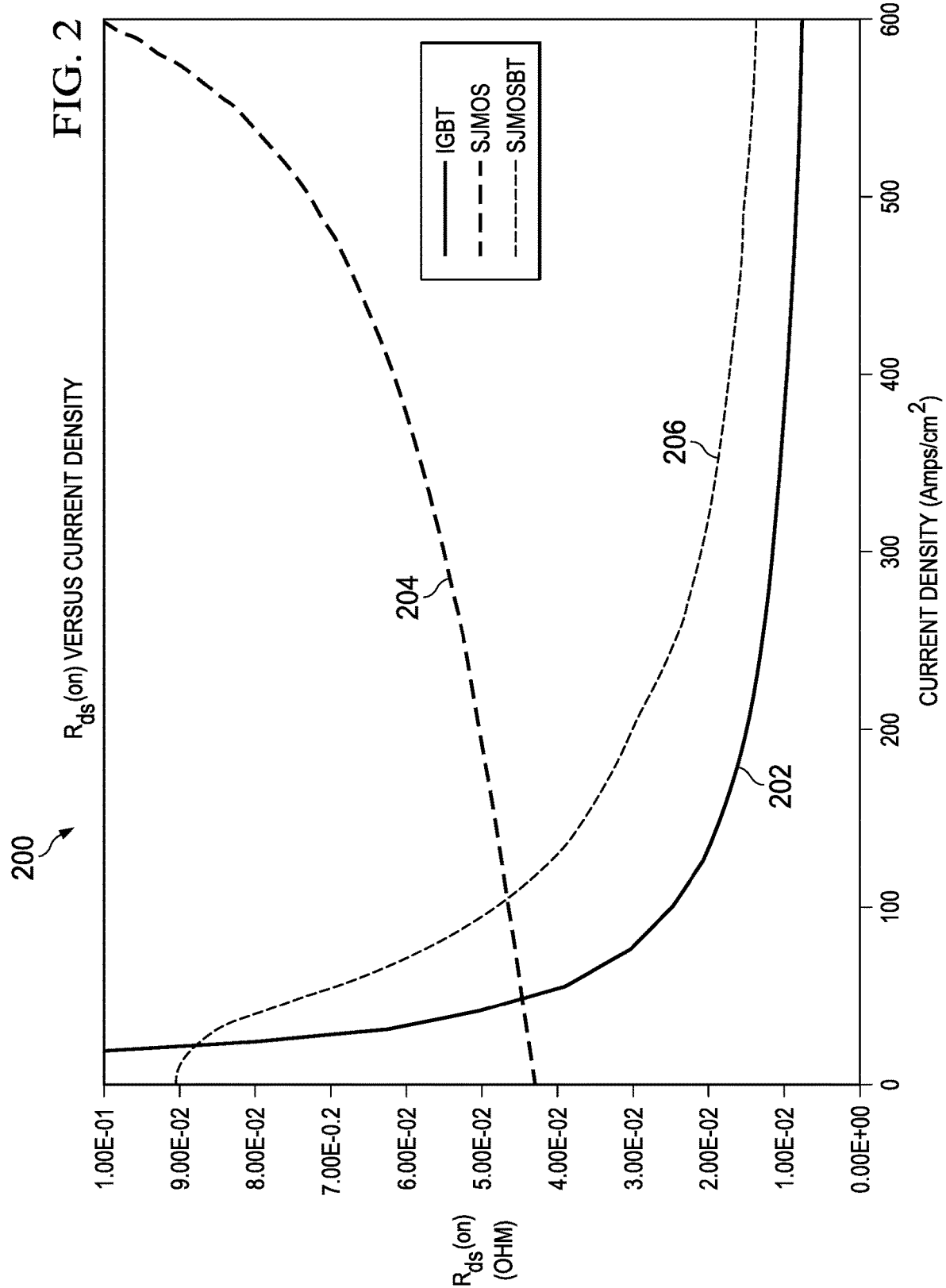

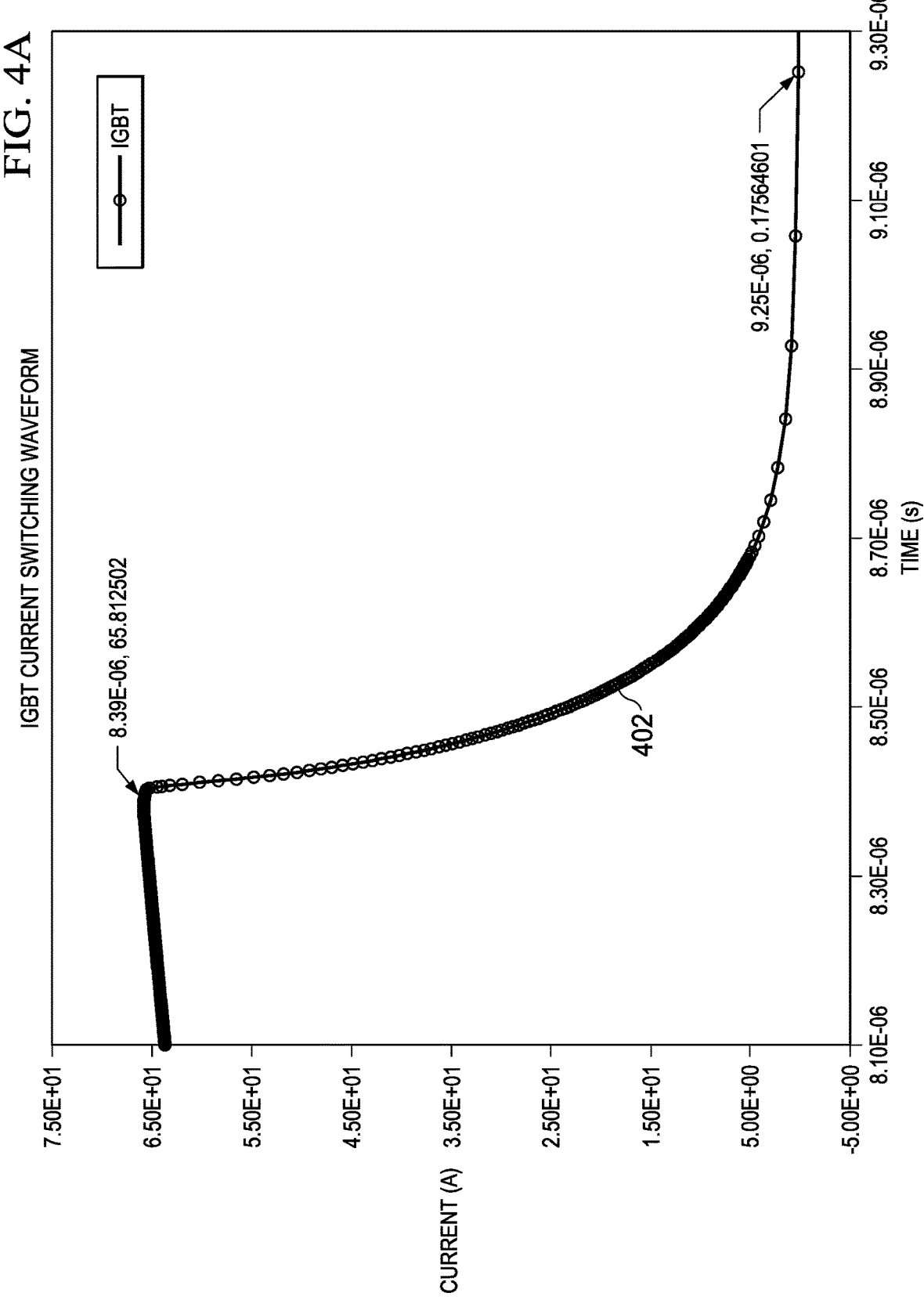

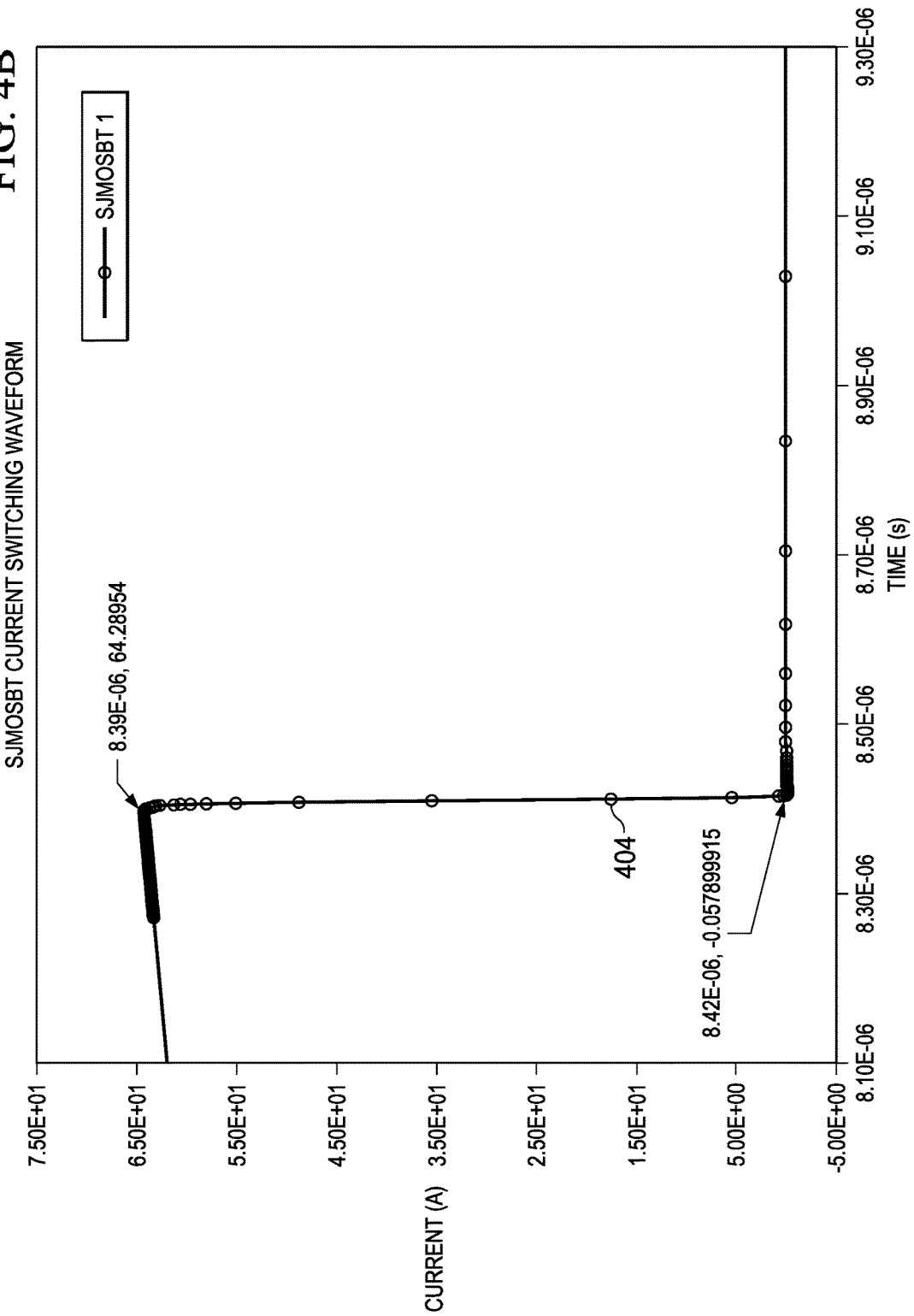

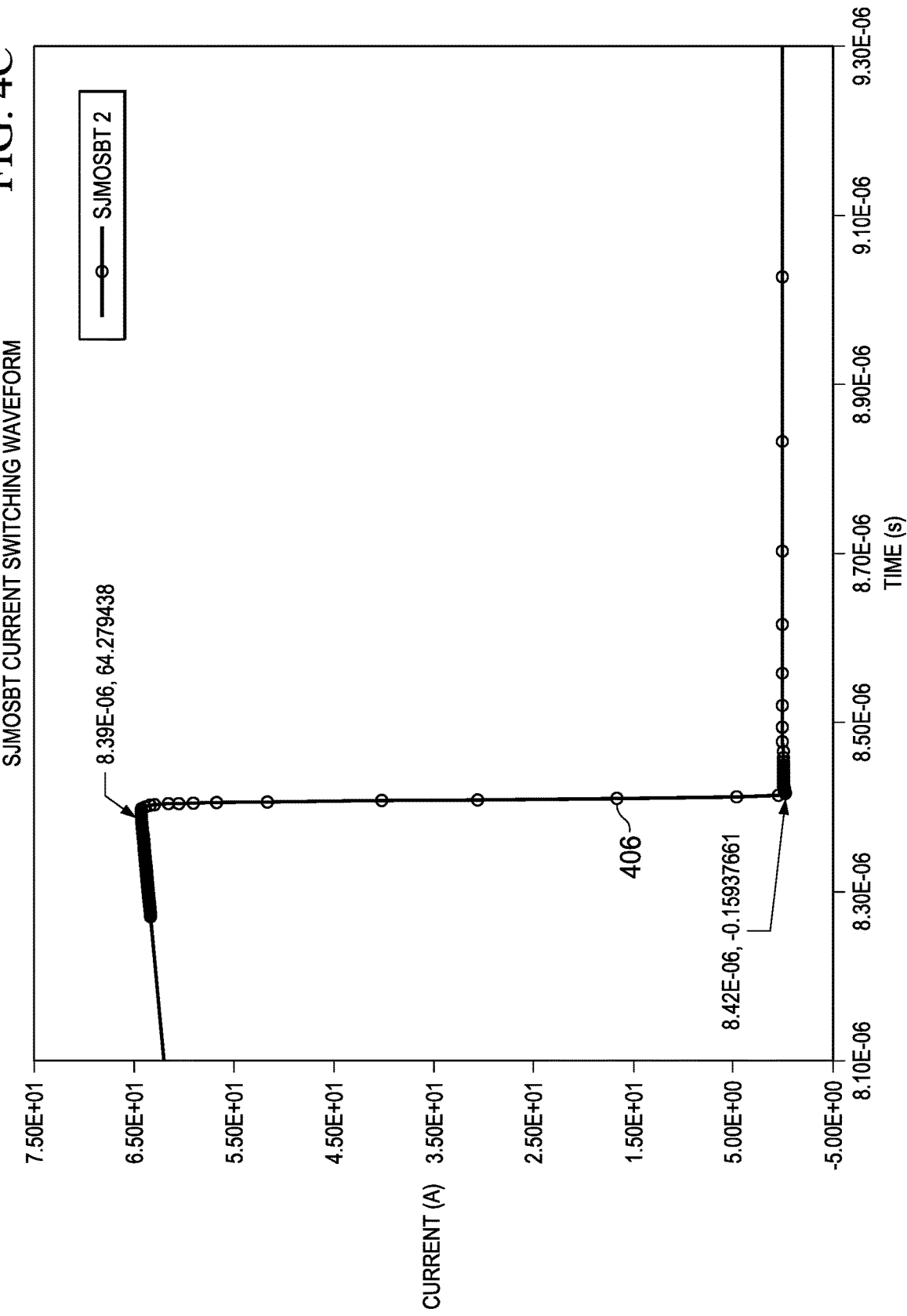

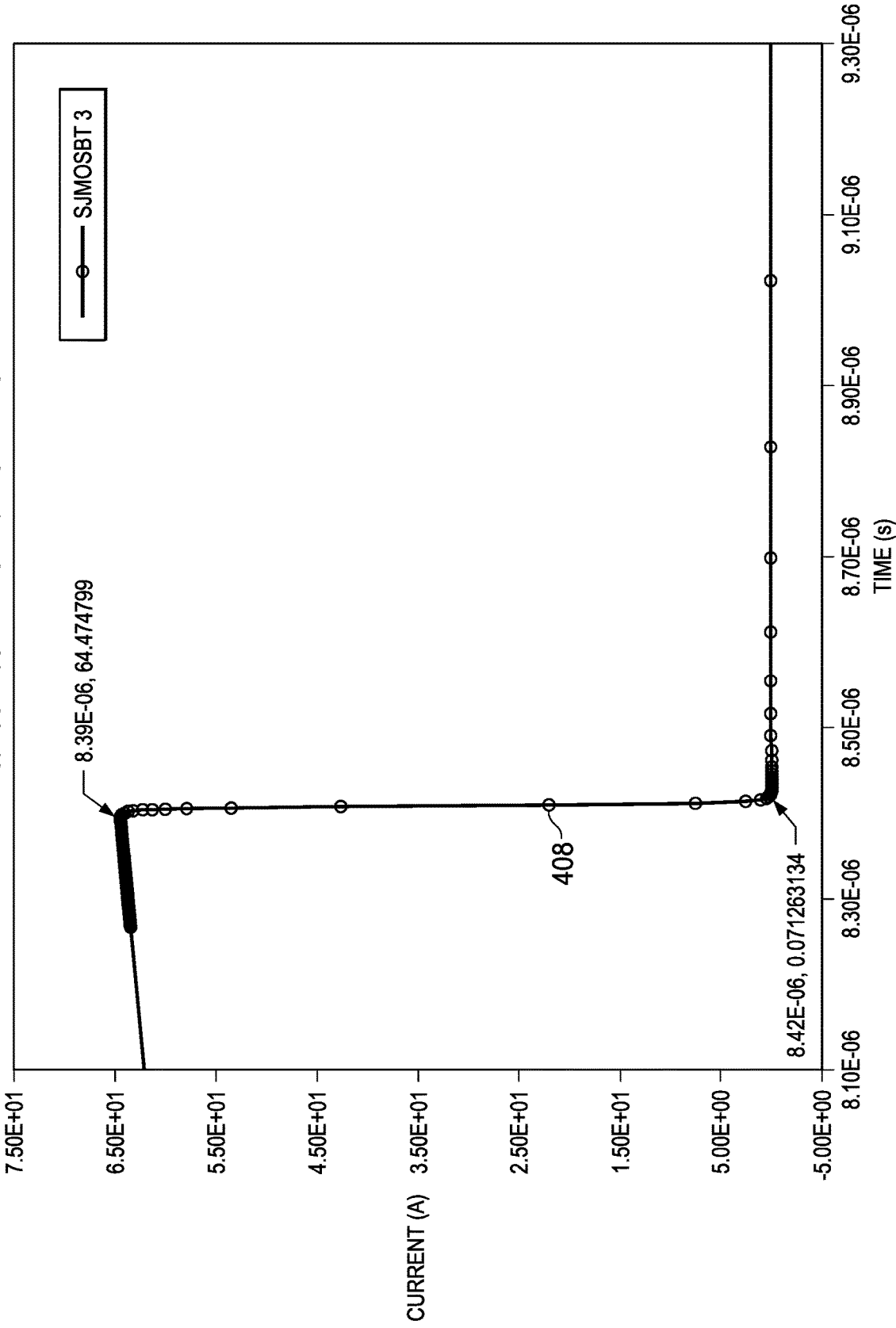

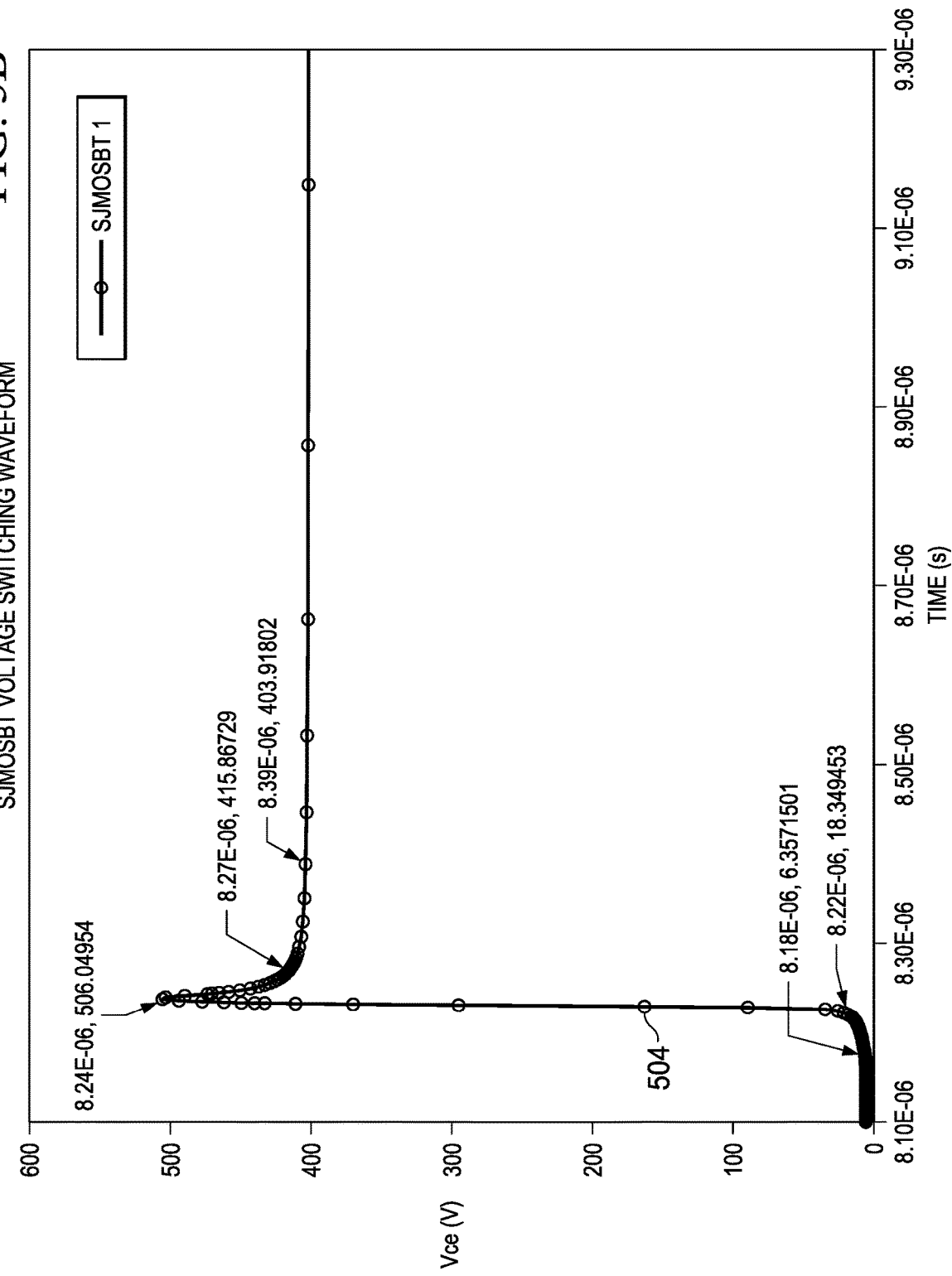

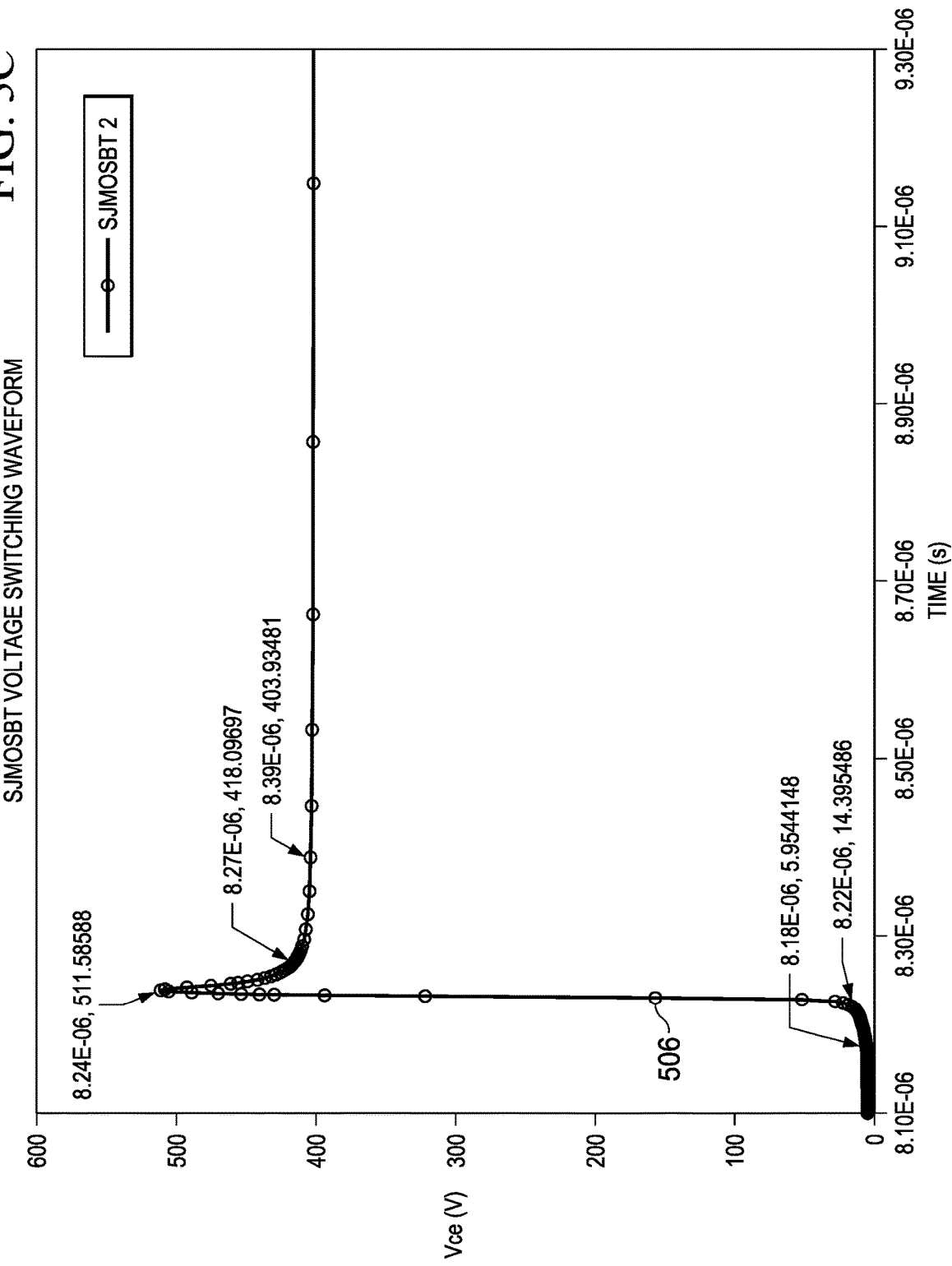

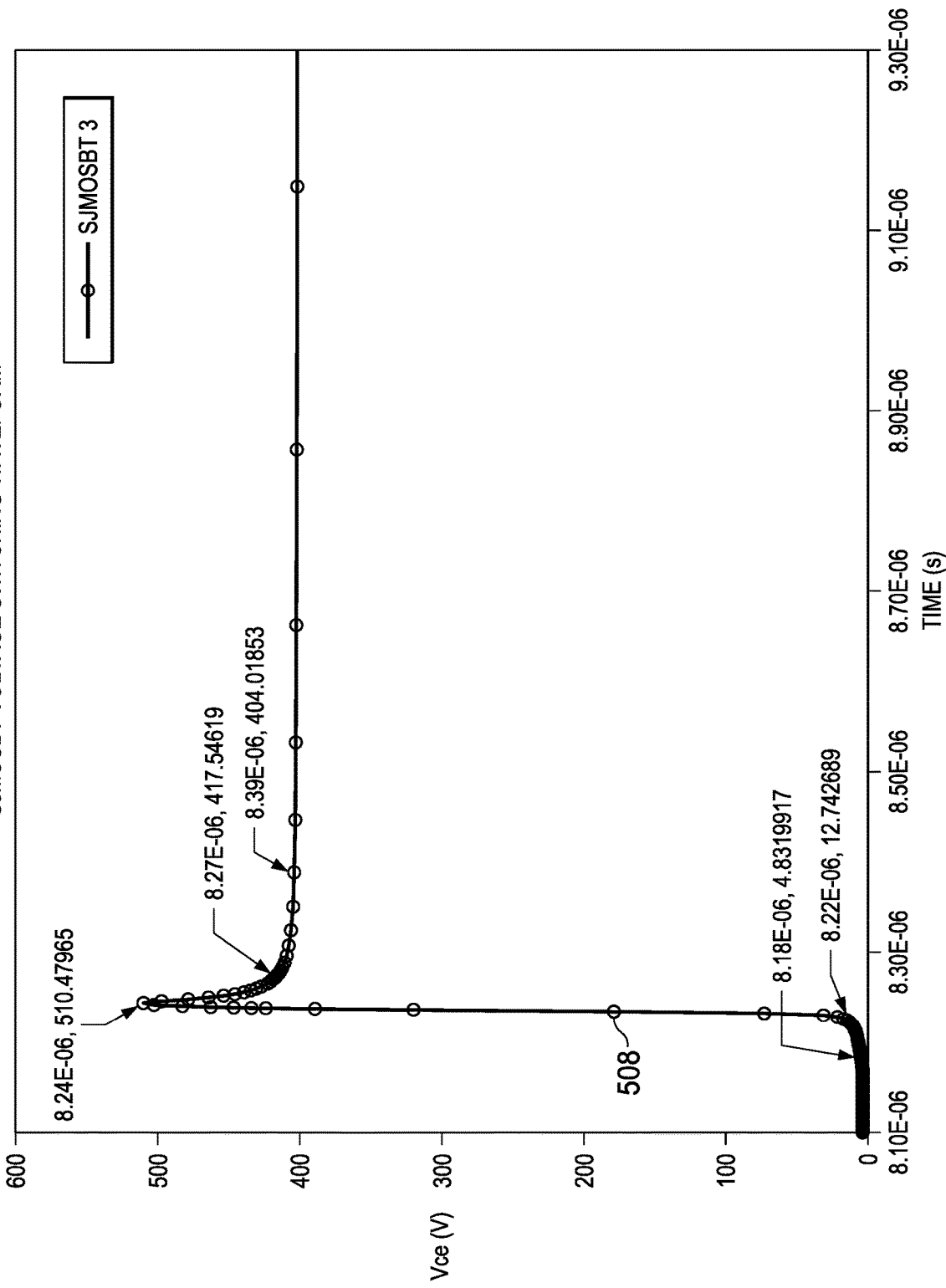

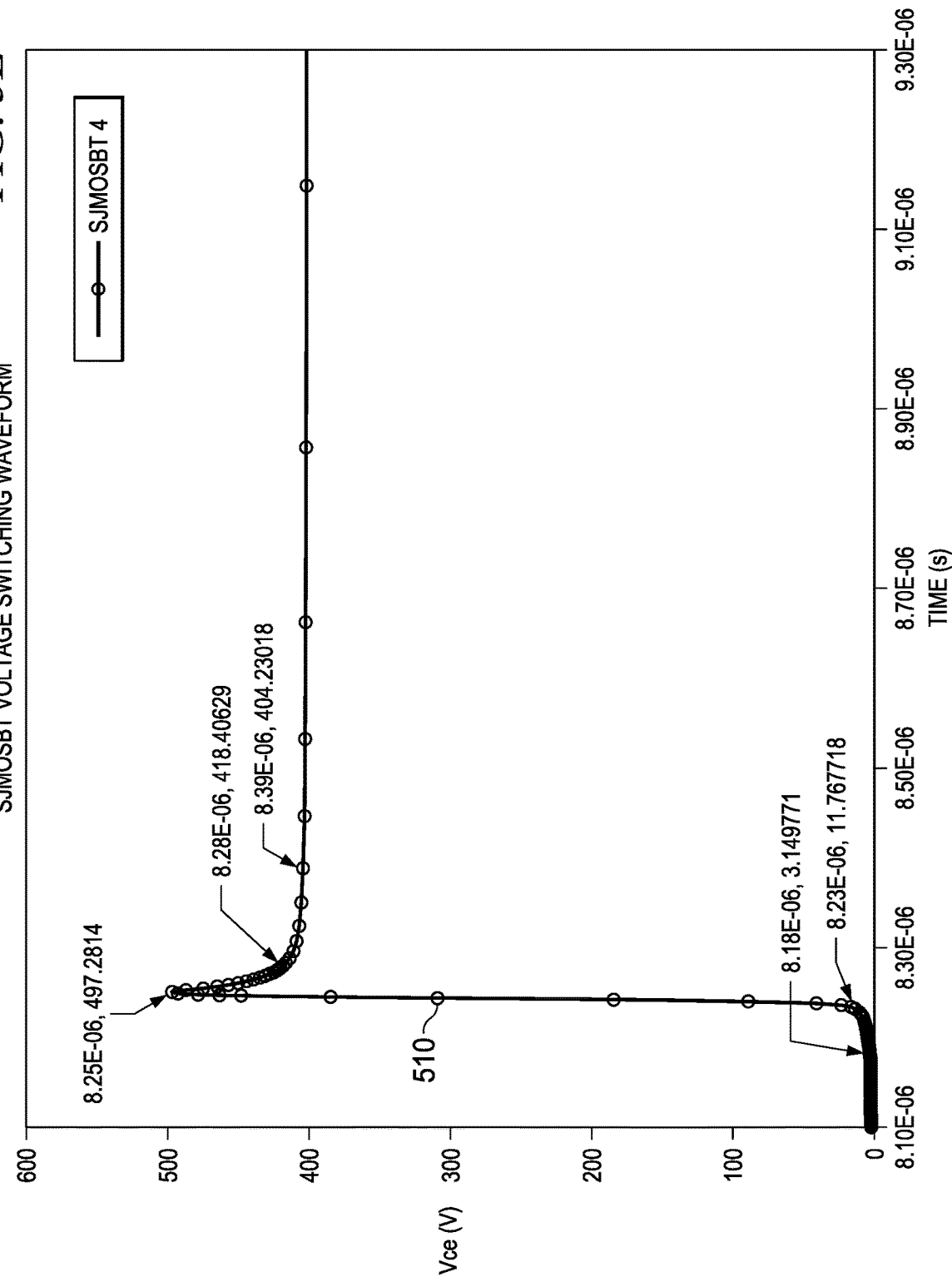

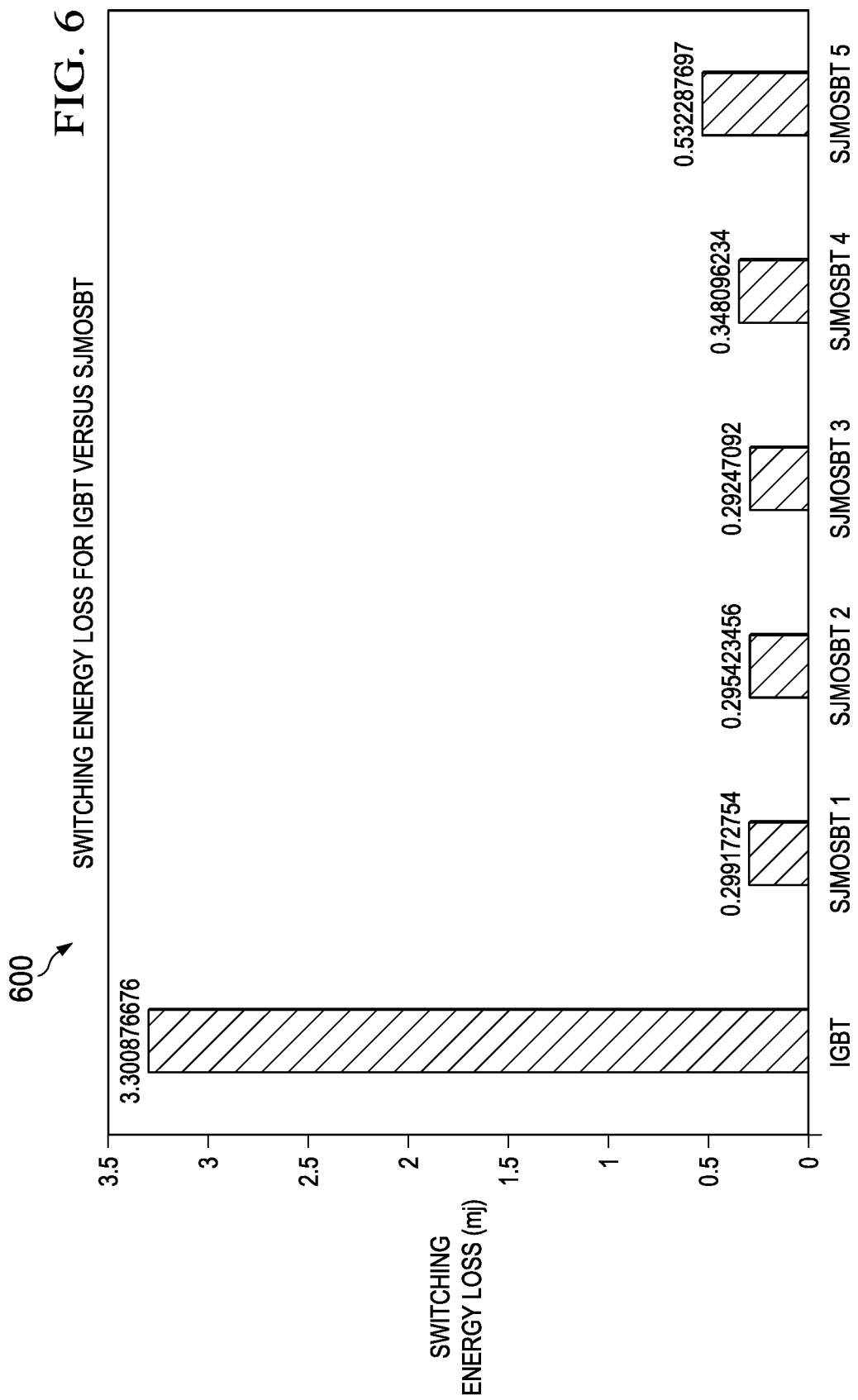

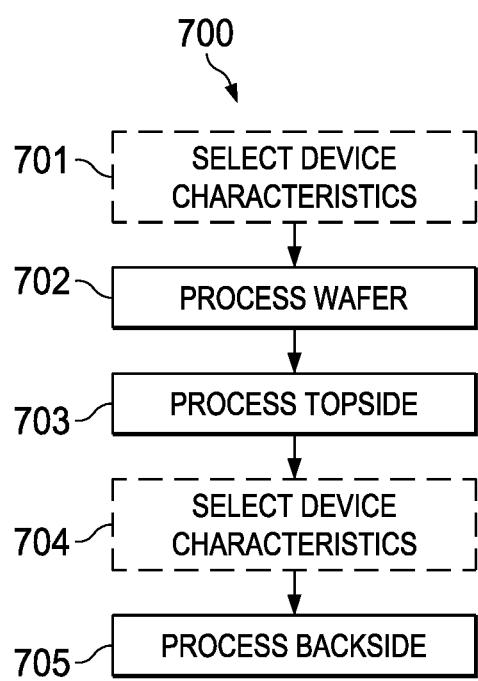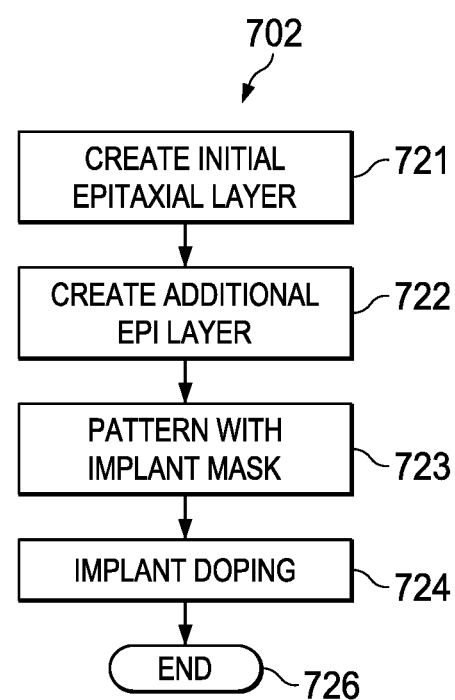
FIG. 7A
FIG. 7B

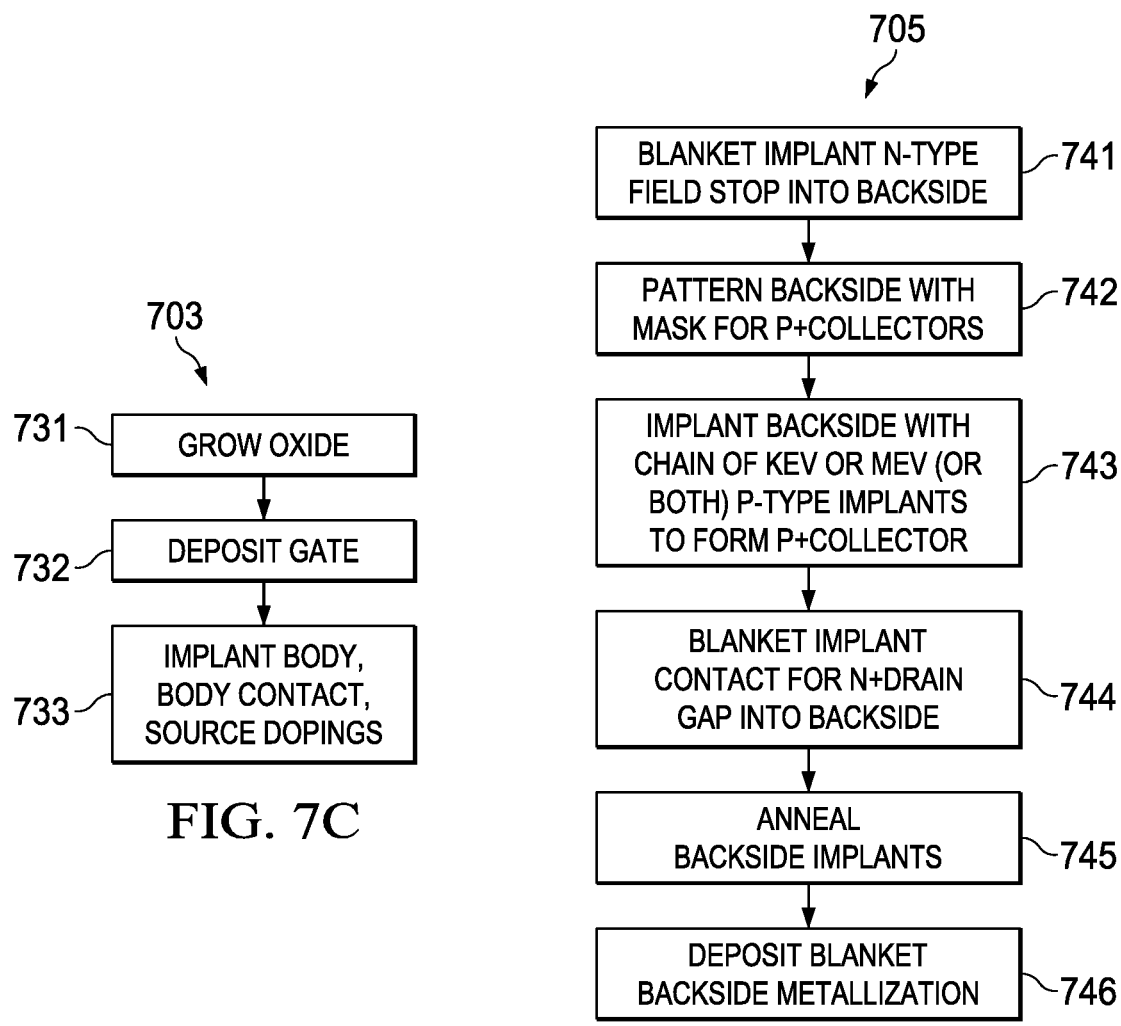

SUPER JUNCTION MOS BIPOLAR TRANSISTOR HAVING DRAIN GAPS

CROSS REFERENCE TO RELATED APPLICATIONS

This application claims priority to U.S. Provisional Application No. 62/468,726, filed Mar. 8, 2017, which is incorporated herein by reference in its entirety to provide continuity of disclosure.

TECHNICAL FIELD OF THE INVENTION

This invention relates generally to increasing the energy efficiency, reducing the switching time, and increasing the current-carrying capability of a power semiconductor switch by optimal combination and design of a merged SuperJunction MOSFET-IGBT transistor. In particular, this invention details methods and designs for a vertical power semiconductor switch having an IGBT-with-built-in-diode bottom-side structure combined with a SJMOS topside structure in such a way as to provide fast switching with low switching losses (MOSFET), low on-resistance at low currents (SJ-MOS), low on-resistance at high currents (IGBT), and high current-density capability (IGBT).

BACKGROUND OF THE INVENTION

When designing power supplies and power conversion systems, significant compromises in energy efficiency must be made in power switch device selection due to the limitations imposed by the switching characteristics of the available switching elements. A MOSFET is capable of fast switching and hence low switching losses, but has limited current-density capability, both of which are due to the majority-carrier nature of the device. An IGBT, on the other hand, is a minority-carrier device which can achieve very high current-density but is limited in switching speed by minority-carrier-lifetime-induced tail current which results in extended turn-off time and thus higher switch-off energy loss compared to the MOSFET. The subject of this invention is an optimal device that combines the best characteristics of both of these types of devices.

DEFINITIONS

"Vertical semiconductor devices" are semiconductor constructs where the primary direction of current flow inside the device is vertical, that is, from top to bottom or bottom to top (or both).

The "equivalent on-resistance" of a semiconductor device is the resistance of the device when it is biased in the on-state by applying certain voltages and/or currents to its terminals. For a power MOSFET, for example, on-resistance is defined as:

$$R_{ds}(\text{on}) = \frac{V_d}{I_d} \qquad \text{Eq. 1}$$

where:
$V_d$=drain voltage; and,
$I_d$=drain current.

For an IGBT, equivalent on-resistance is defined as:

$$R_{eq}(\text{on}) = \frac{V_{ce}}{I_{ce}} \qquad \text{Eq. 2}$$

where:
$V_{ce}$=collector voltage; and,
$I_{ce}$=collector current.

Also, where $I_d$ is typically set to one-half of its rated maximum Id and the gate voltage is set to about 10V for MOSFET, and 15V gate voltage for IGBT.

"Current-density capability" is the amount of current a device is capable of conducting without exceeding its maximum rated temperature, divided by the active device area through which the current is conducted.

"Switching time" is the elapsed time for a device to transition from one state to the other state. The "switch-on" time is the elapsed time to transition from the off-state to the on-state. The "switch-off" time is the elapsed time to transition from the on-state to the off-state. For example, the switch-on time for a power MOSFET is the time between its gate voltage rising to 5-10% of its on-level to its drain voltage falling to within 5-10% of its off-level. Conversely, for example, the switch-off time for a power MOSFET is the time between its gate voltage falling from 5-10% of its on-level to its drain voltage rising to within 5-10% of its off-level.

"Switching energy losses" are generally calculated during switch-on and switch-off transients as the time integral of the non-zero current and voltage waveforms.

"Switching-mode power supplies" are power conversion systems which frequently use power semiconductor switches, to regulate output levels of voltage and current.

"N–type material" refers to silicon doped with N–type impurities which are typically arsenic, phosphorous, antimony or hydrogen.

"P–type material" refers to silicon doped with P–type impurities which are typically boron, aluminum, gallium or indium.

"Cell" refers to at least one vertical transistor.

"Pitch" refers to the distance between contact centers or the width of a single cell.

"About" unless otherwise specified means a tolerance of ±10%.

"Low current density" means below about 100 A/cm².

"High current density" means above about 150 A/cm².

SUMMARY

The preferred embodiment is a vertical super junction MOSFET having charge-balanced columns extending from the topside of the semiconductor device, having an IGBT-like N–type field-stop region and P+collector on the backside of the device, and having gaps in the IGBT P+collector backside region as shown in FIG. 1A. The gaps in the P+collector backside region permit direct connection to the SJMOS N–type drain region and thus allow for low-$R_{ds}(\text{on})$ MOSFET operation during device turn-on and turn-off. A key element of this invention is the design of the P+collector openings (gaps) in terms of both lateral size and doping level, and the design of the surrounding P+collector regions in terms of their doping level and their depth into the backside of the structure. The combination of the gap width and net gap doping, and the extended P+collector depth into the backside and its net doping is designed to result in a voltage drop sufficient to cause the IGBT P+collector to N–type field stop junction to forward-bias at a desired SJMOS drain current level. This current level which forward-biases the P+collector to N−type field stop junction is the current level at which the IGBT turns on and starts to become the dominant current-carrying mode (bipolar) of the mixed device. The device will henceforth be referred to as SJMOSBT (Super Junction MOS Bipolar Transistor).

Further key aspects of this invention are the enhanced switching speed and reduction of switching energy losses as compared to an IGBT. Since the SJMOSBT requires MOSFET current flow to forward-bias the P+collector and initiate the IGBT current, the IGBT current automatically turns on later than the MOSFET current flow and automatically turns off sooner than the MOSFET current flow. This gives the SJMOSBT switching speeds approaching that of a stand-alone MOSFET. The switching speed of a standalone IGBT is usually limited by the turn-off tail current. This lingering tail current is due to the time required for minority carriers to recombine, that is, due to minority-carrier lifetime. Lifetime control is often done in IGBTs by using irradiation or implants or heavy metals to create recombination centers; however, the use of such techniques is quite limited as they trade off tail-current reduction for significantly increased off-state leakage and increased on-state energy loss, both of which add to the DC energy loss of the switch. In the SJMOSBT, since the IGBT-mode current turns off before the MOSFET current, the minority carriers have more effective time in which to recombine and hence the effective tail current is greatly reduced. Furthermore, since the SJMOSBT is a charge-balanced device constructed with alternating n-type doping columns and p-type doping columns, both of which are significantly more highly doped than the typical doping of an n-drift region in a standalone IGBT, minority carrier lifetime is greatly reduced as minority carriers recombine quickly as they collide with the heavily doped charge-balance columns. Further, the highly doped n-type and p-type columns and the inherent minority carrier lifetime control that they exhibit eliminate the necessity of a backside irradiation or metal deposition processing step, typically required in IGBT processing.

Changing the dimensions of the features of the device leads to different device performances and behaviors:

a) The wider the P+collector openings, the more SJMOS-like the overall device behavior;
b) The shallower the P+collector extended doping, the more SJMOS-like the overall device behavior;
c) The higher the N+drain n-type doping in the gap, the more SJMOS-like the overall device behavior;
d) The lower the ratio of N−columns to N+drain gaps, the more SJMOS-like the overall device behavior.

Bipolar conduction can be controlled at high current density levels through the P+collector by careful selection of the P+collector doping level, the depth of the P+collector, N+drain gap width, doping level of the field stop and the doping level of the N+drain gap. At high current density levels, the voltage drop between the collector nodes and the surrounding opposite-type doping is sufficient to forward-bias the collector nodes in order to initiate the bipolar conduction mode.

BRIEF DESCRIPTION OF THE DRAWINGS

FIG. 1B shows a cross-section of a backside of an SJMOSBT structure.

FIG. 2 is a plot of $R_{ds}$(on) versus Current Density for IGBT, SJMOS, and SJMOSBT.

FIG. 4A is a plot that illustrates the current switching waveforms for an IGBT.

FIG. 4B is a plot that illustrates the current switching waveforms for a first SJMOSBT design.

FIG. 4C is a plot that illustrates the current switching waveforms for a second SJMOSBT design.

FIG. 4D is a plot that illustrates the current switching waveforms for a third SJMOSBT design.

FIG. 5B is a plot that illustrates voltage switching waveforms for a first SJMOSBT design variation.

FIG. 5C is a plot that illustrates voltage switching waveforms for a second SJMOSBT design variation.

FIG. 5D is a plot that illustrates voltage switching waveforms for a third SJMOSBT design variation.

FIG. 5E is a plot that illustrates voltage switching waveforms for a fourth SJMOSBT design variation.

FIG. 6 is a bar chart that illustrates the Switch Energy Loss for various SJMOSBT design variations vs. IGBT.

FIG. 7A is a flow chart of a preferred embodiment of a process for creating a vertical semiconductor device.

FIG. 7B is a flow chart of a preferred embodiment of a method for processing a wafer.

FIG. 7C is a flow chart of a preferred embodiment of a method for processing a topside of the wafer.

FIG. 7D is a flow chart of a preferred embodiment of a method for processing a backside of the wafer.

DETAILED DESCRIPTION

A preferred embodiment of the disclosed device is a vertically conducting FET-controlled power device with unipolar conduction at low current densities that transitions to bipolar conduction at high current densities. Bipolar conduction switches on after the unipolar conduction turns on. Unipolar conduction takes place in a highly-doped, charge-balanced drift region, thereby enabling faster switching due to the reduction in minority carrier tail current due to the enhanced recombination of minority carriers in the highly-doped charge-balance regions. Bipolar conduction switches off before the unipolar conduction switches off. These characteristics enable the device to switch faster because of a reduction in minority carrier tail current due to minority carriers starting recombination in the interval between bipolar conduction switch off and unipolar conduction switch off.

Figure 1A:
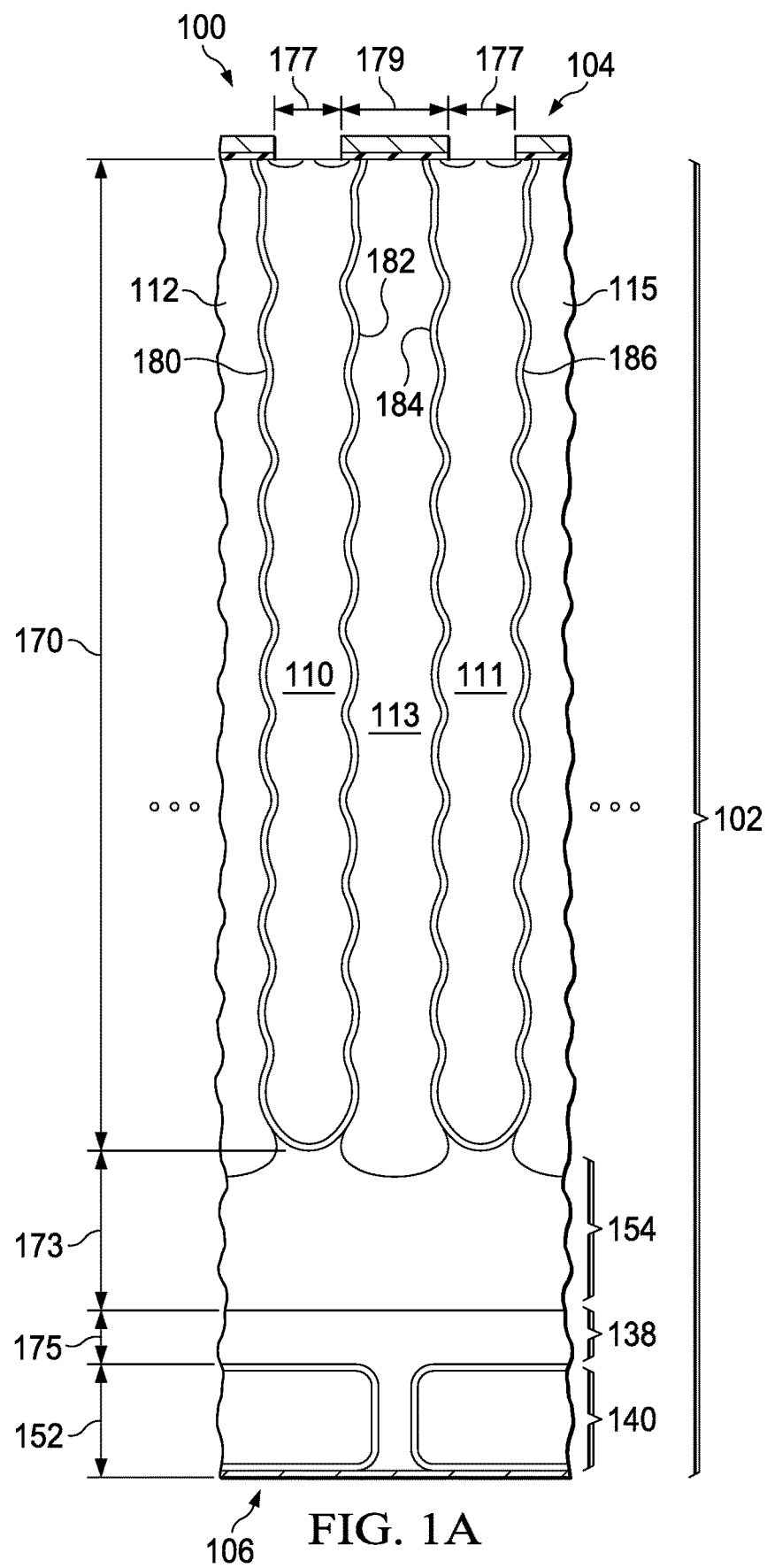
FIG. 1A shows a cross-section of a super junction metal oxide semiconductor bipolar transistor (SJMOSBT) structure.

Referring to FIG. 1A, a partial cross-section of vertical semiconductor device 100 is shown. Vertical semiconductor device 100 is a SJMOSBT formed on wafer 102. Wafer 102 includes topside 104 and backside 106. In a preferred embodiment, many identical devices are formed on the same wafer and may be sectioned into parts that also contain many devices to enable high current capacity.

In a preferred embodiment, vertical semiconductor device 100 is a vertical insulated gate bipolar transistor (IGBT) that includes a topside charge balanced metal oxide semiconductor field effect transistor (MOSFET) and a set of N+drain gaps 144 in P+collector 140 of the IGBT. The gaps enable unipolar operation of the apparatus so that the apparatus is enabled for both unipolar and bipolar operation.

Vertical semiconductor device 100 includes P+columns 110 and 111 and N−columns 112, 113 and 115. The P−columns and N−columns are arranged in a regular alternating pattern, so as to create a charge balance between them. The P−columns and N−columns extend into the wafer by depth 170. In a preferred embodiment, depth 170 can range between about 35 µm and about 45 µm (±10%). P+columns 110 and 111 each have width 177. In a preferred embodiment, width 177 is on average about 3.0 µm (±10%). Doping of the P−columns is about $7 \times 10^{15}$ atoms/cm$^3$ (±10%). N−column 113 has typical width 179. In a preferred embodiment, width 179 is about 3.0 µm (±10%). Doping of the N−columns is about $7 \times 10^{15}$ atoms/cm$^3$ (±10%). The overlapping intersections between the P−columns and the N−columns form P−N junctions 180, 182, 184 and 186.

Vertical semiconductor device 100 includes N−drift region 154 formed below P+columns 110 and 111. N−drift region 154 is constructed of N-type material with doping 1-2 orders of magnitude below the surrounding material. In one embodiment, doping of the N−drift region is about $7 \times 10^{14}$ atoms/cm$^3$ (±10%). In a preferred embodiment, N−drift region 154 has depth 173. In one embodiment, depth 173, that is, the distance between the bottom of the P−columns and the N−type field stop is approximately 7 µm (±10%). In a typical embodiment, the depth may range from about 4 µm (±10%) to about 10 µm (±10%).

Referring to FIG. 1B, N-type field stop 138 is formed as a layer below the N−drift region. N-type field stop 138 has depth 175, which, in a preferred embodiment is about 2.5 µm (±10%). N-type field stop 138 is constructed of N-type material that has doping of between about $10^{15}$ and about $10^{17}$ atoms/cm$^3$ (±10%).

P+collector 140 is formed as a layer beneath N-type field stop 138. P+collector 140 extends into wafer 102 to depth 152. Depth 152 is typically on the order of 1 µm-5 µm, and is typically obtained using a series of chained mid-energy or high-energy implants or both. Doping of the P+collector is P-type material and can vary from about $10^{17}$ atoms/cm$^3$ (±10%) to about $10^{19}$ atoms/cm$^3$ (±10%).

N+drain gap 144 is formed in P+collector 140. N+drain gap 144 forms an SJMOS N-type drain and allows unipolar conduction at low current density levels and enables bipolar conduction through the P+collector 140 at high current density levels. N+drain gap 144 permits direct connection to the SJMOS N−drift region 154, which allows for low-$R_{ds}$(on) MOSFET operation during device switch on and switch off. N+drain gap 144 extends into wafer 102 to a depth 152, which is generally about the same depth as P+collector 140. N+drain gap 144 has gap width 150. Gap width 150 is typically on the order of about 0.5 µm to about 8 µm (±10%). N+drain gap 144 has an n-type doping level between about $10^{14}$ and about $10^{16}$ atoms/cm$^3$ (±10%). The portion of the N+drain gap 144 within about 1-2 µm of the N-type field stop 138 has a doping level between about $10^{14}$ and about $10^{17}$ atoms/cm$^3$ (±10%) because of outdiffusion from the N-type field stop region 138. N+drain gap 144 transitions to drain contact 148. The portion of the N+drain gap 144 within about 1-2 µm of drain contact 148 has a doping level between about $10^{15}$ and about $10^{17}$ atoms/cm$^3$ (±10%) because of outdiffusion from drain contact 148.

Drain contact 148 is in contact with N+drain gap 144 and P+collector 140. Drain contact 148 has an n-type doping level between about $10^{18}$ and about $10^{20}$ atoms/cm$^3$ (±10%). In a preferred embodiment, the connection between N+drain gap 144 and P+collector 140 is provided by metal layer 156.

P−N junctions 141 and 142 are formed between P+collector 140 and each side of N+drain gap 144. In operation, the combination of gap width 150, depth 152 and the net doping of the gap, the P+collector and the N-type field stop results in a voltage drop sufficient to cause P−N junctions 145 and 146 to forward-bias at a desired SJMOS drain current level as a direct result of this drain current passing through the gap. This current level also forward-biases the P−N junction between N-type field stop 138 and P+collector 140 and as a result causes bipolar operation of the device as the dominant current-carrying mode. Prior to reaching this current level, unipolar operation of vertical semiconductor device 100 is the dominant current-carrying mode.

Figure 1C:
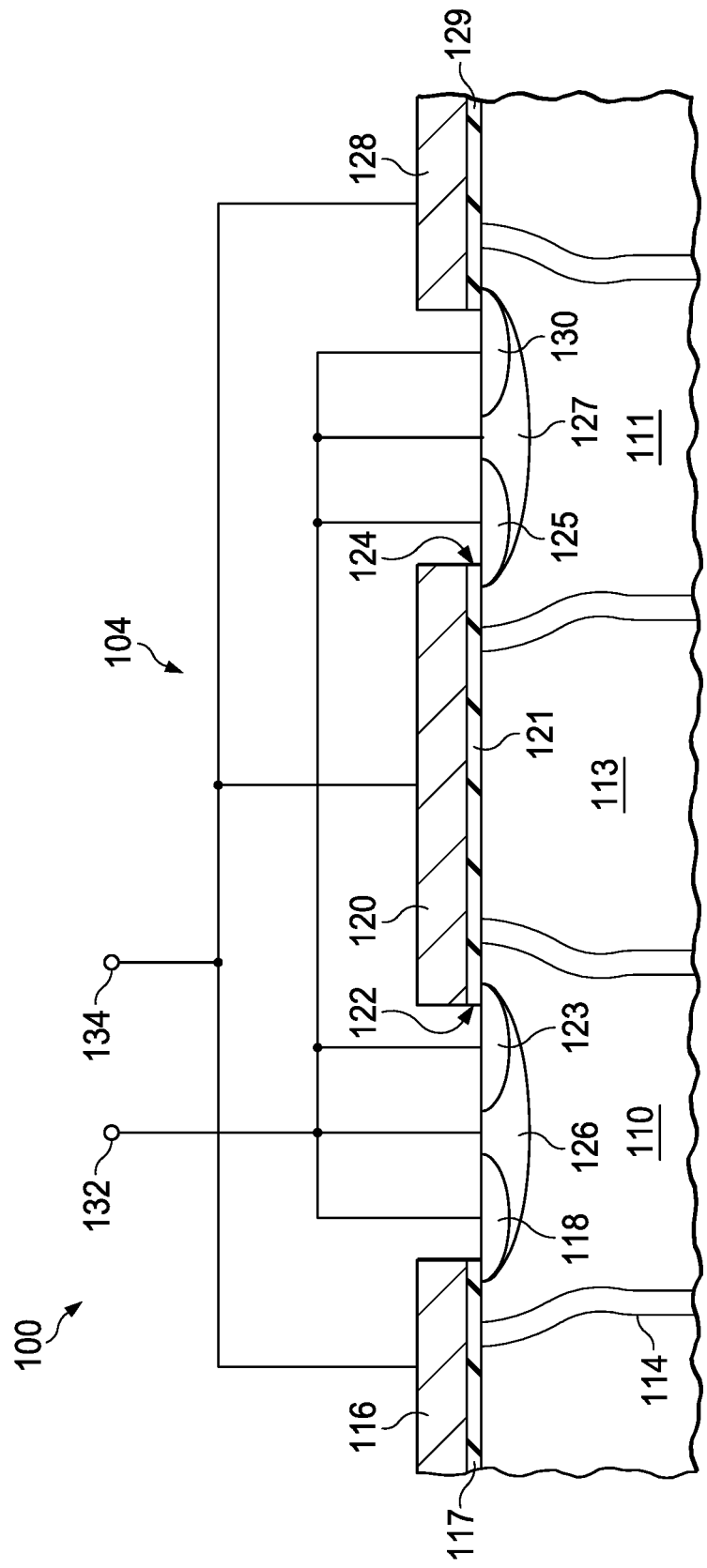
FIG. 1C shows a cross-section of a topside of an SJMOSBT structure.

Referring then to FIG. 1C, topside 104 of vertical semiconductor device 100 is shown. Topside 104 includes source terminal 132 and gate terminal 134. Source terminal 132 is connected to source portions 118, 123, 125 and 130, and also to body contact portions 126 and 127. Gate terminal 134 is connected to gate portions 116, 120 and 128. Gate portion 116 is directly above and adjacent oxide portion 117, which is above source portion 118 at one end. Source portion 118 is adjacent source portion 123. Source portion 118, source portion 123, and body contact portion 126 are each located at the top of P+column 110. Gate portion 120 is above and directly adjacent oxide portion 121, which is above source portion 123 at first end 122 and above source portion 125 at second end 124. Source portion 125 is adjacent source portion 130. Source portion 125, source portion 130, and body contact portion 127 are located at the top of P+column 111. Gate portion 128 is above and directly adjacent oxide portion 129, which is above source portion 130 at one end. Gate portions 116, 120, and 128 are typically n-type polysilicon. The gate portions are typically about 3 µm-5 µm wide (±10%) and less than about 1 µm deep (±10%). Source portions 118, 123, 125, and 130 are n-doped silicon, typically arsenic and/or phosphorus. The source portions are typically less than about 1 µm wide and less than about 1 µm deep (±10%). In another preferred embodiment, each of the source portions for each of the oxide portions are discrete, do not overlap, and are formed with separate electrically isolated doping wells.

Figure 1D:
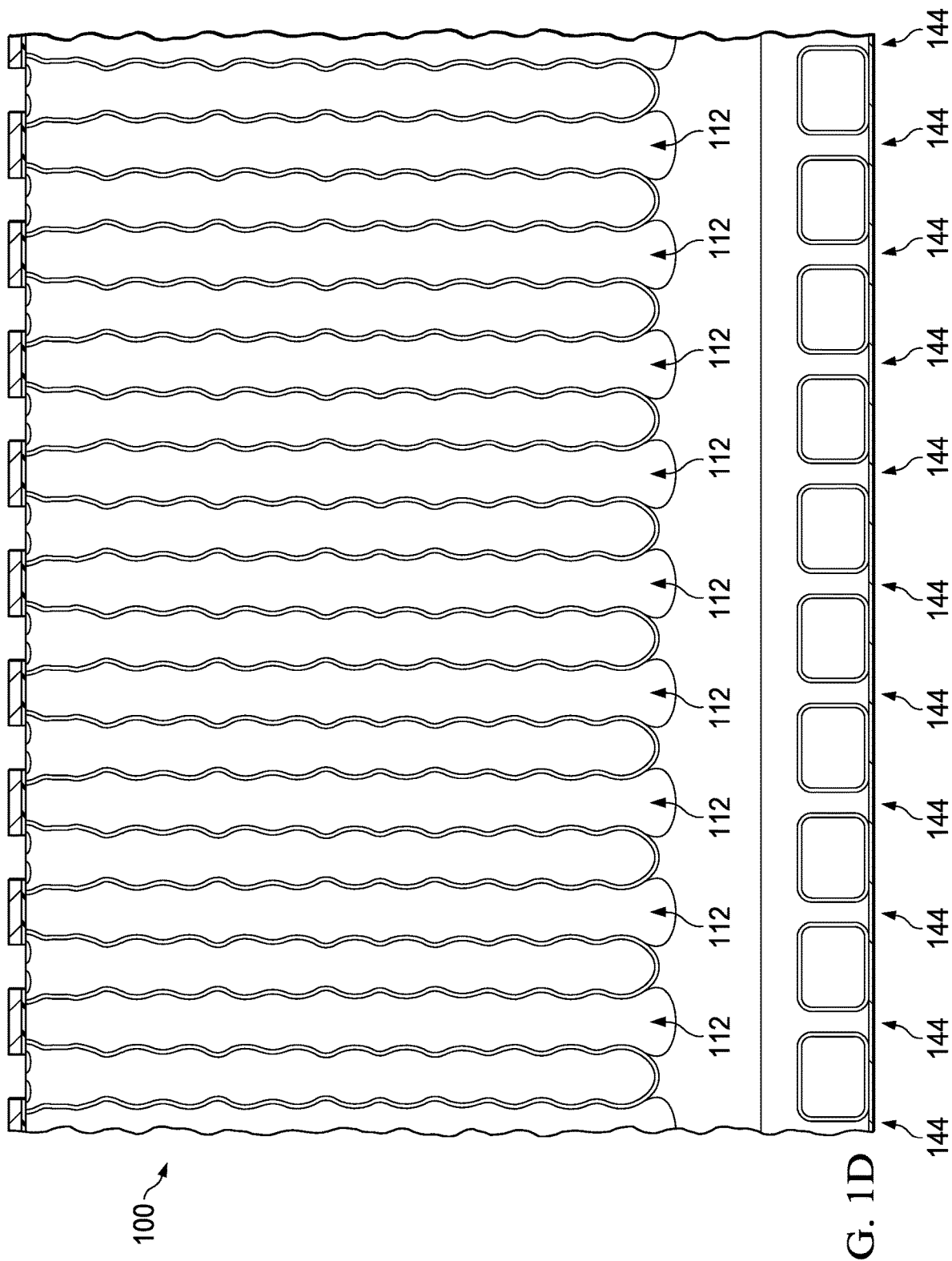
FIG. 1D shows a cross-section of an SJMOSBT structure with a 1 to 1 column to gap ratio.

Referring to FIG. 1D, another preferred embodiment is shown. In this embodiment, vertical semiconductor device 100 has one N+drain gap 144 for every N−column 112. This device transitions from SJMOS behavior (unipolar conduction and increasing $R_{ds}$(on) with increasing drain current) to IGBT behavior (bipolar conduction and decreasing $R_{ds}$(on) with increasing collector current) at a very high level of drain current, since the large number of drain current openings (i.e., N+drain gaps 144 in P+collector 140) is close to the number of N–columns and so reduces the current flowing through any single opening, thus requiring a higher total drain current to achieve the forward-biasing of the P+collector to N–field stop diode.

Figure 1E:
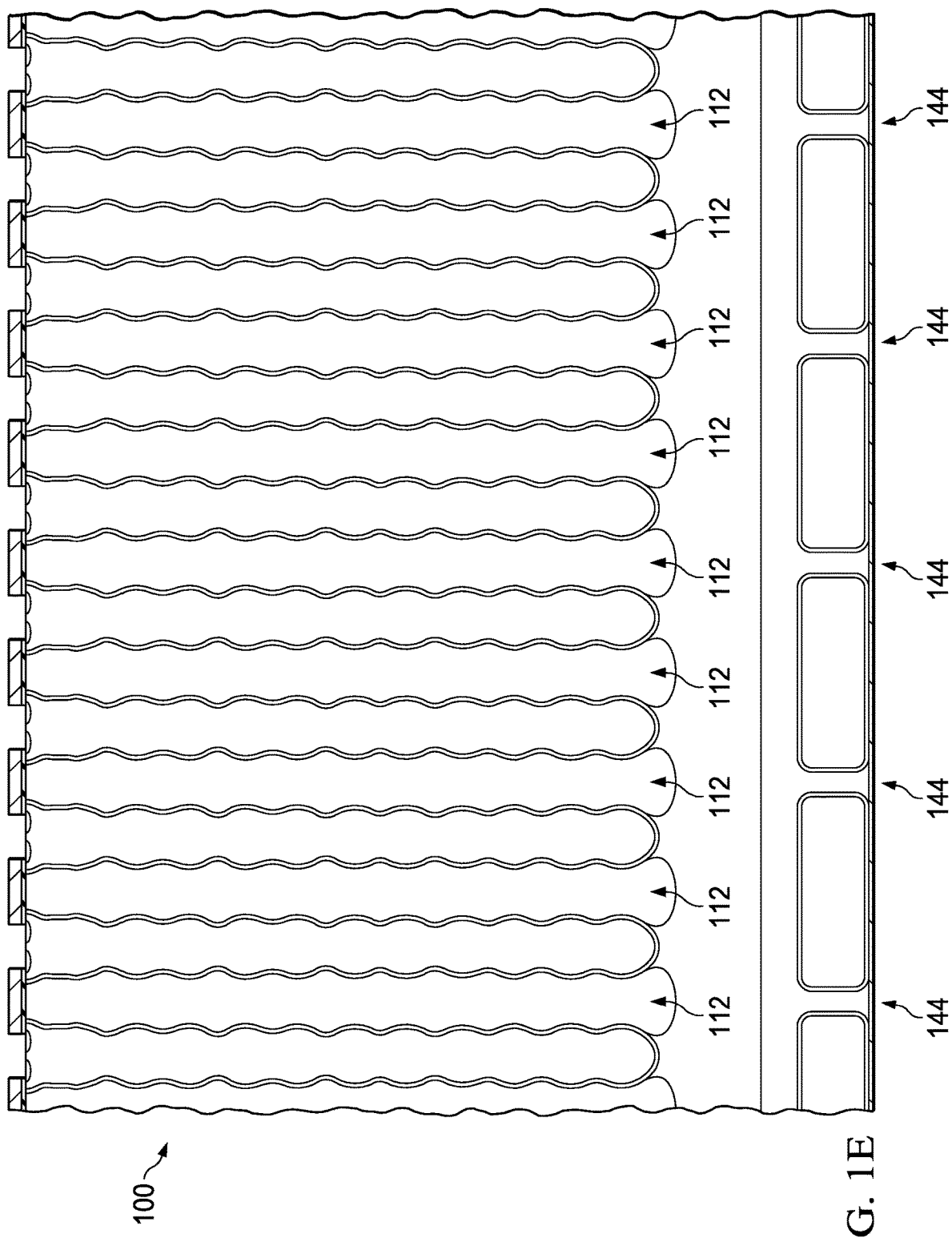
FIG. 1E shows a cross-section of an SJMOSBT structure with a 2 to 1 column to gap ratio.

Referring to FIG. 1E, another preferred embodiment is shown. In this embodiment, vertical semiconductor device 100 has one N+drain gap 144 for every two N–column 112. This device transitions from SJMOS behavior to IGBT behavior at a lower level of drain current compared to the device in FIG. 1D, since the fewer number of drain current openings, in relation to the number of N–columns, increases the current flowing through any single opening, thus requiring a lower total drain current to achieve the forward-biasing of the P+collector to N–field stop diode required.

Figure 1F:
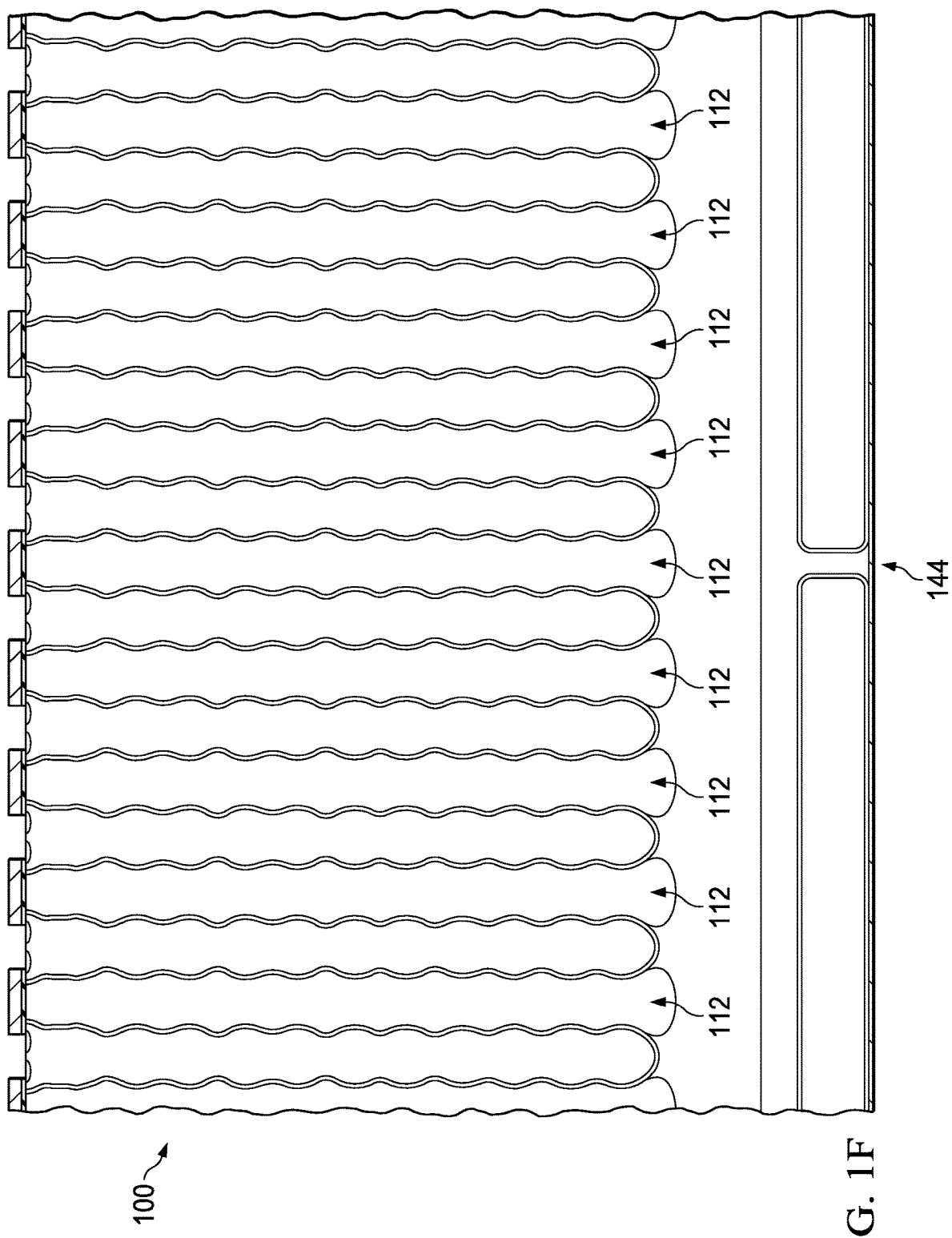
FIG. 1F shows a cross-section of an SJMOSBT structure with a 10 to 1 column to gap ratio.

Referring to FIG. 1F, another preferred embodiment is shown. In this embodiment, vertical semiconductor device 100 has one N+drain gap 144 for every ten N–column 112. This device transitions from SJMOS behavior to IGBT behavior at a lower level of drain current compared to the device in FIG. 1E, since the fewer number of drain current openings, in relation to the number of N–columns increases the current flowing through any single opening, thus requiring a lower total drain current to achieve the forward-biasing of the P+collector to N–field stop diode.

Referring then to FIG. 2, plot 200 of $R_{ds}$(on) versus current density between IGBT, SJMOS, and SJMOSBT devices is shown. Curve 202 is for a traditional IGBT device and starts with a large on-resistance at zero current density and exponentially decays to less than $1 \times 10^{-2}$ ohms at 600 Amperes per centimeters squared (A/cm$^2$). Curve 204 is for a traditional SJMOS device that starts with an on-resistance that increases generally exponentially at current densities greater than 400 A/cm$^2$. Curve 206 is for a mixed device, such as vertical semiconductor device 100. As can be seen at low current densities, the on-resistance is about $9 \times 10^{-2}$ ohms and well below the on-resistance of the IGBT. As current density increases, the on-resistance of the SJMOSBT decreases, in a generally exponential fashion, approaching a steady $1.2 \times 10^{-2}$ ohms at 600 A/cm$^2$.

Figure 3:
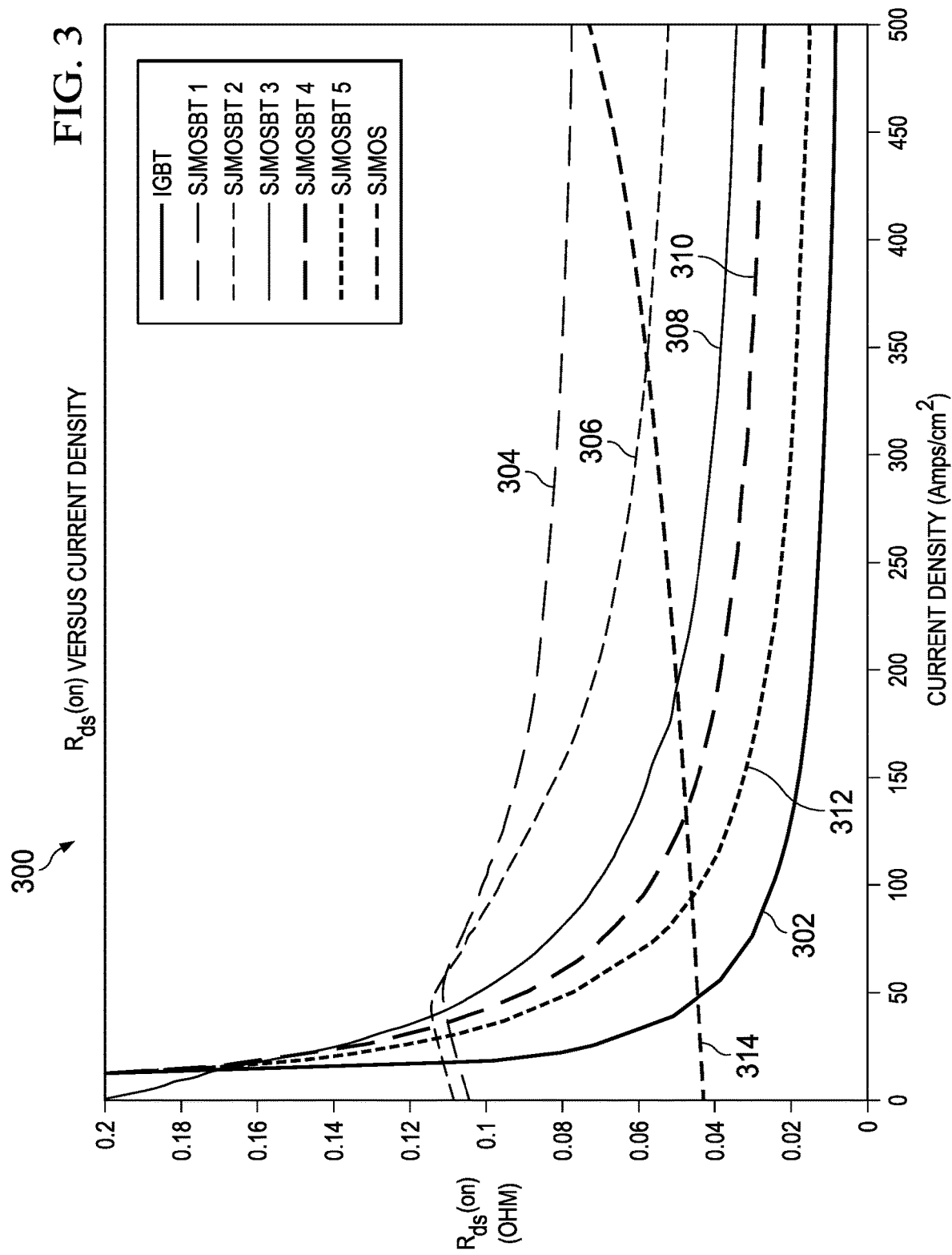
FIG. 3 is a plot that illustrates $R_{ds}$(on) vs. Current Density for various SJMOSBT design variations vs. IGBT.

Referring then to FIG. 3, plot 300 of $R_{ds}$(on) versus current density comparison by showing five different designs for SJMOSBT structures (SJMOSBT 1, SJMOSBT

TABLE 1

|  | Final drain gap width in micrometers (±10%) | Drain gap n-type doping in atoms/cm$^3$ (±10%) | Collector depth in micrometers (±10%) | Collector p-type doping in atoms/cm$^3$ (±10%) |
|---|---|---|---|---|
| Range of values for SJMOSBT | 1 to 6 | $10^{14}$ to $10^{16}$ | 1 to 5 | $10^{17}$ to $10^{19}$ |
| IGBT | 0 | N/A | 1 | $2.00 \times 10^{19}$ |
| SJMOSBT 1 | 6.0 | $7.30 \times 10^{14}$ | 4.1 | $2.40 \times 10^{17}$ |
| SJMOSBT 2 | 5.0 | $6.80 \times 10^{14}$ | 4.4 | $2.00 \times 10^{19}$ |
| SJMOSBT 3 | 2.5 | $6.90 \times 10^{14}$ | 4.1 | $2.40 \times 10^{17}$ |
| SJMOSBT 4 | 2.0 | $6.90 \times 10^{14}$ | 4.4 | $2.00 \times 10^{19}$ |
| SJMOSBT 5 | 1.0 | $7.20 \times 10^{14}$ | 4.4 | $2.00 \times 10^{19}$ |
| SJMOS | N/A | $1.00 \times 10^{15}$ | 0 | N/A |

Table 2 below enumerates additional parameters for SJMOSBT 1, SJMOSBT 2, SJMOSBT 3, SJMOSBT 4, and SJMOSBT 5. 2, SJMOSBT 3, SJMOSBT 4, and SJMOSBT 5), one IGBT, and one SJMOS is shown. Table 1 below describes the parameters of the devices of FIG. 3.

TABLE 2

|  | Pitch of Four Cells (μm) (±10%) | Total P+Collector Width (μm) (±10%) | Drawn Drain width (Drawn Gap in P+Collector), (μm) (±10%) | Drawn Gap % of width of every 4 Cells (±10%) | P+Collector Implant Dose @ each Energy (±10%) |
|---|---|---|---|---|---|
| SJMOSBT 1 | 24 | 18.0 | 6.0 | 25% | $10^{13}$ |
| SJMOSBT 2 | 24 | 18.0 | 6.0 | 25% | $10^{15}$ |
| SJMOSBT 3 | 24 | 21.0 | 3.0 | 12.5% | $10^{13}$ |
| SJMOSBT 4 | 24 | 21.0 | 3.0 | 12.5% | $10^{15}$ |
| SJMOSBT 5 | 24 | 21.6 | 2.4 | 10% | $10^{15}$ |

The collectors of the five different SJMOSBT designs are created by implanting P+dopant impurities into the backside of the wafer six times at different energy levels. Different embodiments may use different numbers of implants at different energy levels to achieve a desired collector depth and dopant level. Table 2 above identifies the implant dosage level used for each of six implants of dopant impurities for SJMOSBT 1, SJMOSBT 2, SJMOSBT 3, SJMOSBT 4, and SJMOSBT 5.

Table 3 below enumerates the energy levels that are used for the six implants of dopant impurities for SJMOSBT 1, SJMOSBT 2, SJMOSBT 3, SJMOSBT 4, and SJMOSBT 5. For example, each P+collector implant for SJMOSBT 1 implants $10^{13}$ atoms/cm$^2$ of dopant impurities into the masked backside of the vertical semiconductor. The first implant is performed at about 450 thousand electron-volts (KeV), the second implant at about 925 KeV, the third implant at about 1400 KeV, the fourth implant at about 1850 KeV, the fifth implant at about 2325 KeV, and the sixth implant at about 2800 KeV. The energy level increases for each successive implant to place the doping impurities further into the wafer.

TABLE 3

| | P+collector: Six Implants at the following energies (KeV) (±10%) | | | | | |
|---|---|---|---|---|---|---|
| | Energy 1 | Energy 2 | Energy 3 | Energy 4 | Energy 5 | Energy 6 |
| SJMOSBT 1 | 450 | 925 | 1400 | 1850 | 2325 | 2800 |
| SJMOSBT 2 | 450 | 925 | 1400 | 1850 | 2325 | 2800 |
| SJMOSBT 3 | 450 | 925 | 1400 | 1850 | 2325 | 2800 |
| SJMOSBT 4 | 450 | 925 | 1400 | 1850 | 2325 | 2800 |
| SJMOSBT 5 | 450 | 925 | 1400 | 1850 | 2325 | 2800 |

Preferred embodiments can vary in the number of implants and dosage for each energy level, including those identified in Table 4 below.

TABLE 4

| | Minimum (±10%) | Maximum (±10%) |
|---|---|---|
| Number of Implant Steps | 1 | 10 |
| Implant Dose (atoms/cm$^2$) | $10^{12}$ | $10^{17}$ |
| First Energy Level (Kev) | 300 | 700 |
| Second Energy Level (Kev) | 600 | 1200 |
| Third Energy Level (Kev) | 1100 | 1600 |
| Fourth Energy Level (Kev) | 1500 | 2100 |
| Fifth Energy Level (Kev) | 2000 | 2600 |
| Sixth Energy Level (Kev) | 2500 | 3100 |
| Seventh Energy Level (Kev) | 3000 | 3600 |
| Eighth Energy Level (Kev) | 3500 | 4200 |
| Ninth Energy Level (Kev) | 4100 | 4700 |
| Tenth Energy Level (Kev) | 4600 | 5200 |

SJMOSBT 1, shown by curve 304, has the most SJMOS-like on-resistance curve due to having the largest gap width, highest gap doping, lowest collector depth, and lowest collector doping of the SJMOSBTs.

SJMOSBT 2, shown by curve 306, has the second most SJMOS-like on-resistance curve. SJMOSBT 2 had the same mask-drawn drain gap as SJMOSBT 1 but then used a P+collector implant that was two orders of magnitude higher than SJMOSBT1, resulting in a smaller gap width and gap doping, and a larger collector depth than SJMOSBT 1. For both SJMOSBT 1 and SJMOSBT 2, FIG. 3 clearly shows the distinctive transition from SJMOS-mode ($R_{ds}$(on) increase with increasing current density) to IGBT-mode ($R_{ds}$(on) decrease with increasing current density).

SJMOSBT 3, shown by curve 308, has the third most IGBT-like on-resistance curve. SJMOSBT 3 had a mask-drawn drain gap that was half the width of SJMOSBT 1 and SJMOSBT 2, and the same P+collector implant as SJMOSBT 1, resulting in a much smaller final gap width than SJMOSBT 1 and SJMOSBT 2, and hence much more IGBT-like $R_{ds}$(on) versus current density, although the transition from SJMOS-like to IGBT-like can still be observed around 20 A/cm$^2$.

SJMOSBT 4, shown by curve 310, has the second most IGBT-like on-resistance curve. SJMOSBT 4 had the same mask-drawn drain gap as SJMOSBT 3 but then used a P+collector implant that was two orders of magnitude higher than SJMOSBT3, resulting in a smaller gap width, similar gap doping, and a larger collector depth than SJMOSBT 3.

SJMOSBT 5, shown by curve 312, has the most IGBT-like on-resistance curve. SJMOSBT 5 had a smaller mask-drawn drain gap than SJMOSBT 3 and 4, and the same P+collector implant as SJMOSBT 4, resulting in the smallest gap width of the SJMOSBTs.

An IGBT device is shown by curve 302 and an SJMOS device is shown by curve 314. SJMOSBT 1 (curve 304) and SJMOSBT 2 (curve 306) are the most SJMOS-like of the SJMOSBT devices with lower on-resistance at very low current densities compared to the IGBT of curve 302. SJMOSBT 4 (curve 310) and SJMOSBT 5 (curve 312) are the most IGBT-like of the SJMOSBT devices with high on-resistance at very low current densities and lower on-resistance at higher current densities. These variations show that it is possible to control the SJMOSBT characteristics, depending on the chosen gap width, gap doping level, collector depth, and collector doping level. This design flexibility allows for optimizing the device for best performance in a variety of end-use circuit applications.

Referring to FIGS. 4A through 4F, curve 402 shows the current switching waveform for the IGBT described in FIG. 3 and curves 404, 406, 408, 410, and 412 of FIGS. 4B through 4F show the current switching respectively for SJMOSBT 1, SJMOSBT 2, SJMOSBT 3, SJMOSBT 4, and SJMOSBT 5 described in FIG. 3.

Referring then to FIG. 4A, curve 402 shows that the current for the IGBT begins to turn off at about 8.39 microseconds from about 65 amps and settles at about 9.25 microseconds to about 0.18 amps for a current switching time of about 0.86 microseconds with each value being selected from a range of plus or minus 10 percent that is based on the geometry of the device.

Referring then to FIG. 4B, curve 404 shows that the current for the first SJMOSBT begins to turn off at about 8.39 microseconds from about 64 amps and switches off at about 8.42 microseconds at about −0.06 amps for a current switching time of about 0.03 microseconds with each value being selected from a range of plus or minus 10 percent that is based on the geometry of the device.

Referring then to FIG. 4C, curve 406 shows that the current for the second SJMOSBT begins to turn off at about 8.39 microseconds from about 64 amps and switches off at about 8.42 microseconds at about −0.16 amps for a current switching time of about 0.03 microseconds with each value being selected from a range of plus or minus 10 percent that is based on the geometry of the device.

Referring then to FIG. 4D, curve 408 shows that the current for the third SJMOSBT begins to turn off at about 8.39 microseconds from about 64 amps and switches off at about 8.42 microseconds at about 0.07 amps for a current switching time of about 0.03 microseconds with each value being selected from a range of plus or minus 10 percent that is based on the geometry of the device.

Figure 4E:
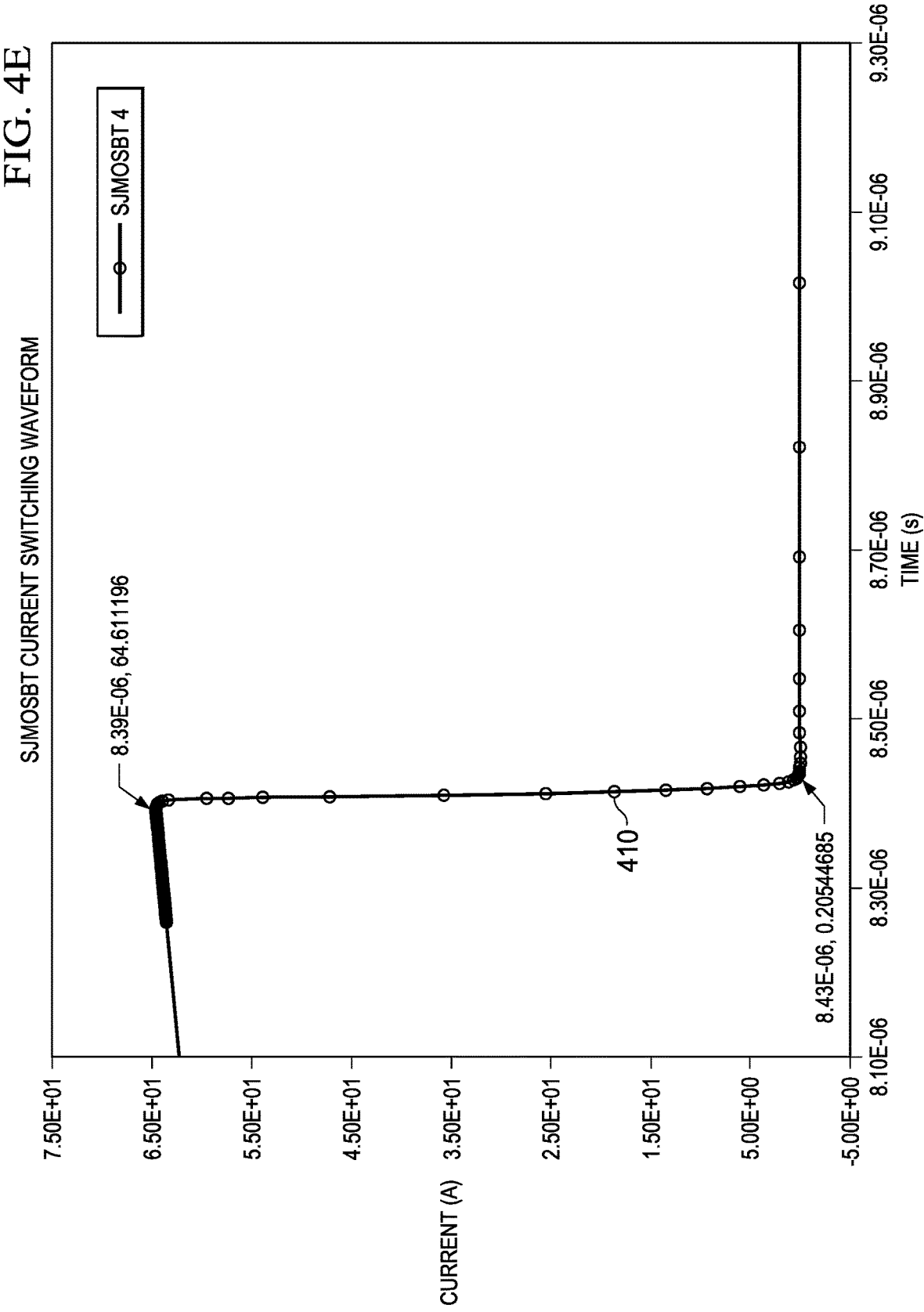
FIG. 4E is a plot that illustrates the current switching waveforms for a fourth SJMOSBT design.

Referring then to FIG. 4E, curve 410 shows that the current for the fourth SJMOSBT begins to turn off at about 8.39 microseconds from about 64 amps and switches off at about 8.43 microseconds at about 0.21 amps for a current switching time of about 0.04 microseconds with each value being selected from a range of plus or minus 10 percent that is based on the geometry of the device.

Figure 4F:
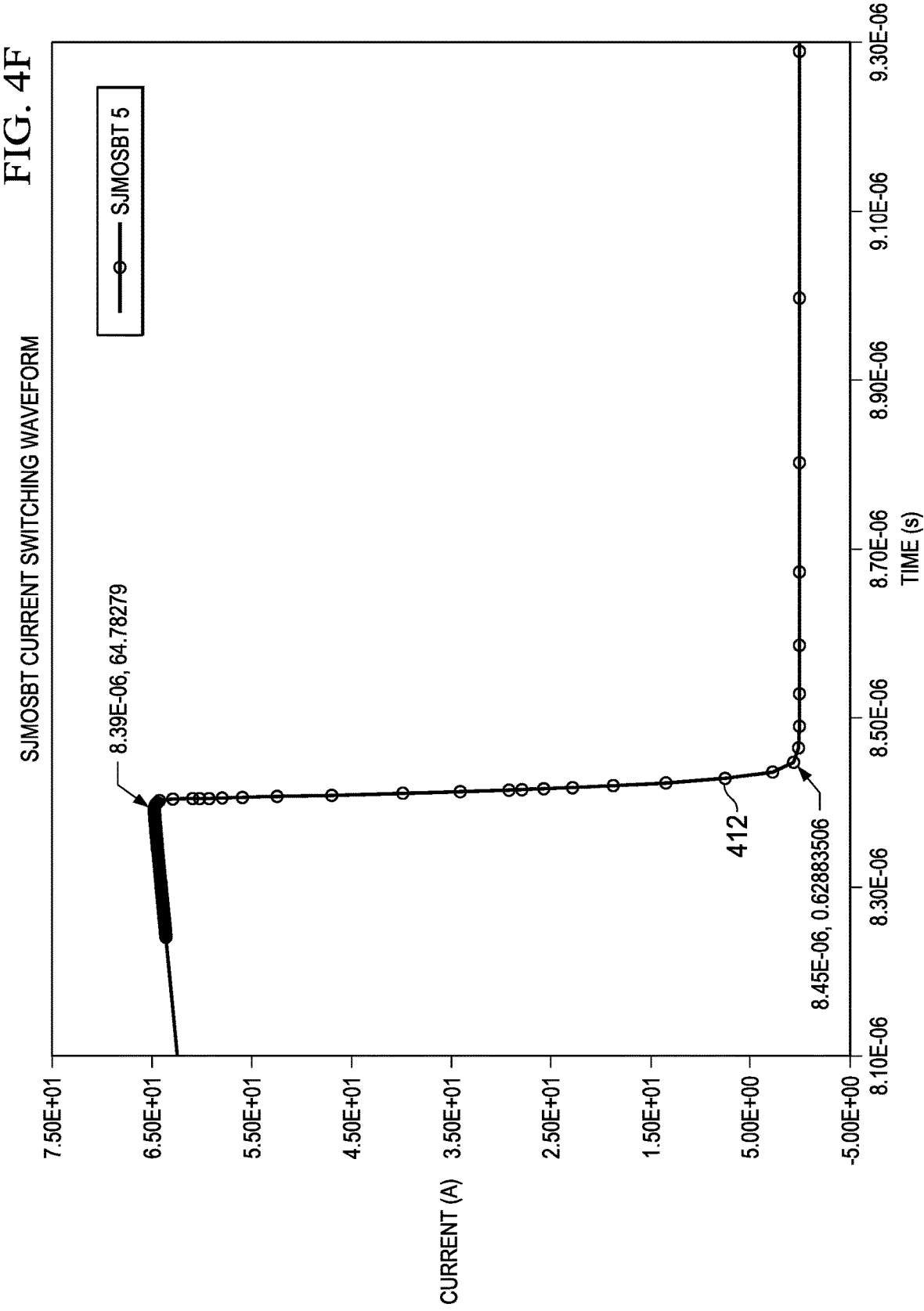
FIG. 4F is a plot that illustrates the current switching waveforms for a fifth SJMOSBT design.

Referring then to FIG. 4F, curve 412 shows that the current for the fifth SJMOSBT begins to turn off at about 8.39 microseconds from about 64 amps and switches off at about 8.45 microseconds at about 0.63 amps for a current switching time of about 0.06 microseconds with each value being selected from a range of plus or minus 10 percent that is based on the geometry of the device.

Referring to FIGS. 5A through 5F, curve 502 shows the voltage switching waveform for the IGBT described in FIG. 3 and curves 504, 506, 508, 510, and 512 of FIGS. 5B through 5F show the voltage switching respectively for SJMOSBT 1, SJMOSBT 2, SJMOSBT 3, SJMOSBT 4, and SJMOSBT 5 described in FIG. 3.

Figure 5A:
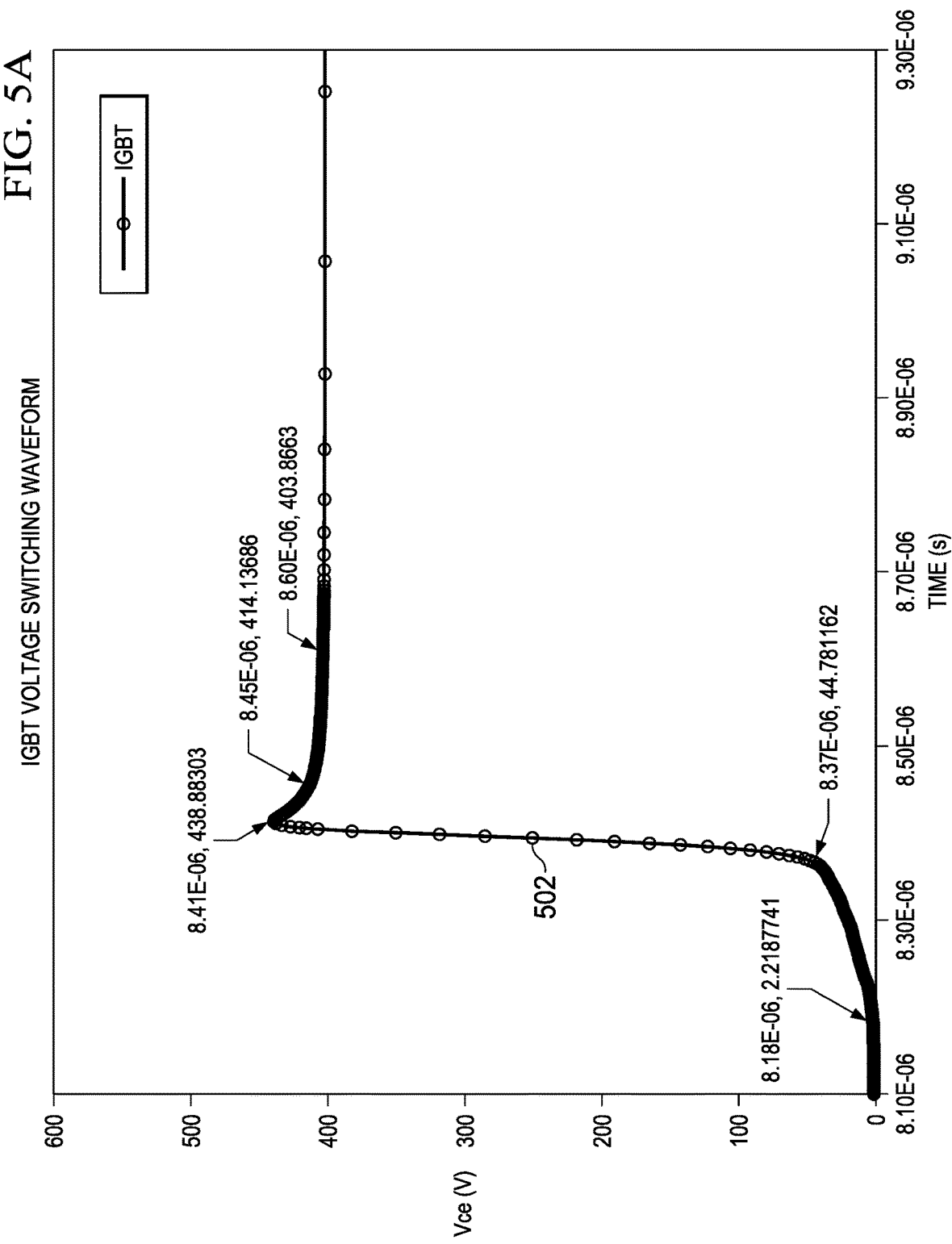
FIG. 5A is a plot that illustrates voltage switching waveforms for an IGBT.

Referring then to FIG. 5A, curve 502 shows a voltage switching waveform for an IGBT. The device begins to turn on at about 8.18 microseconds at about 2.22 volts, begins to ramp vertically at about 8.37 microseconds at about 44.78 volts, overshoots at about 8.41 microseconds to about 438.88 volts, begins to ramp horizontally at about 8.45 microseconds at about 414.14 volts, and settles at about 8.60 microseconds at about 403.87 volts with each value being selected from a range of plus or minus 10 percent that is based on the geometry of the device.

Referring then to FIG. 5B, curve 504 shows a voltage switching waveform for a first SJMOSBT. The device begins to turn on at about 8.18 microseconds at about 6.35 volts, begins to ramp vertically at about 8.22 microseconds at about 18.35 volts, overshoots at about 8.24 microseconds to about 506.05 volts, begins to ramp horizontally at about 8.27 microseconds at about 415.87 volts, and settles at about 8.39 microseconds at about 403.92 volts with each value being selected from a range of plus or minus 10 percent that is based on the geometry of the device and which is a clear improvement over the switching time of the IGBT of curve 502 of FIG. 5A.

Referring then to FIG. 5C, curve 506 shows a voltage switching waveform for a second SJMOSBT. The device begins to turn on at about 8.18 microseconds at about 5.95 volts, begins to ramp vertically at about 8.22 microseconds at about 14.40 volts, overshoots at about 8.24 microseconds to about 511.59 volts, begins to ramp horizontally at about 8.27 microseconds at about 418.10 volts, and settles at about 8.39 microseconds at about 403.93 volts with each value being selected from a range of plus or minus 10 percent that is based on the geometry of the device and which is a clear improvement over the switching time of the IGBT of curve 502 of FIG. 5A.

Referring then to FIG. 5D, curve 508 shows a voltage switching waveform for a third SJMOSBT. The device begins to turn on at about 8.18 microseconds at about 4.83 volts, begins to ramp vertically at about 8.22 microseconds at about 12.74 volts, overshoots at about 8.24 microseconds to about 510.48 volts, begins to ramp horizontally at about 8.27 microseconds at about 417.55 volts, and settles at about 8.39 microseconds at about 404.02 volts with each value being selected from a range of plus or minus 10 percent that is based on the geometry of the device and which is a clear improvement over the switching time of the IGBT of curve 502 of FIG. 5A.

Referring then to FIG. 5E, curve 510 shows a voltage switching waveform for a fourth SJMOSBT. The device begins to turn on at about 8.18 microseconds at about 3.15 volts, begins to ramp vertically at about 8.23 microseconds at about 11.77 volts, overshoots at about 8.25 microseconds to about 497.28 volts, begins to ramp horizontally at about 8.28 microseconds at about 418.41 volts, and settles at about 8.39 microseconds at about 404.23 volts with each value being selected from a range of plus or minus 10 percent that is based on the geometry of the device and which is a clear improvement over the switching time of the IGBT of curve 502 of FIG. 5A.

Figure 5F:
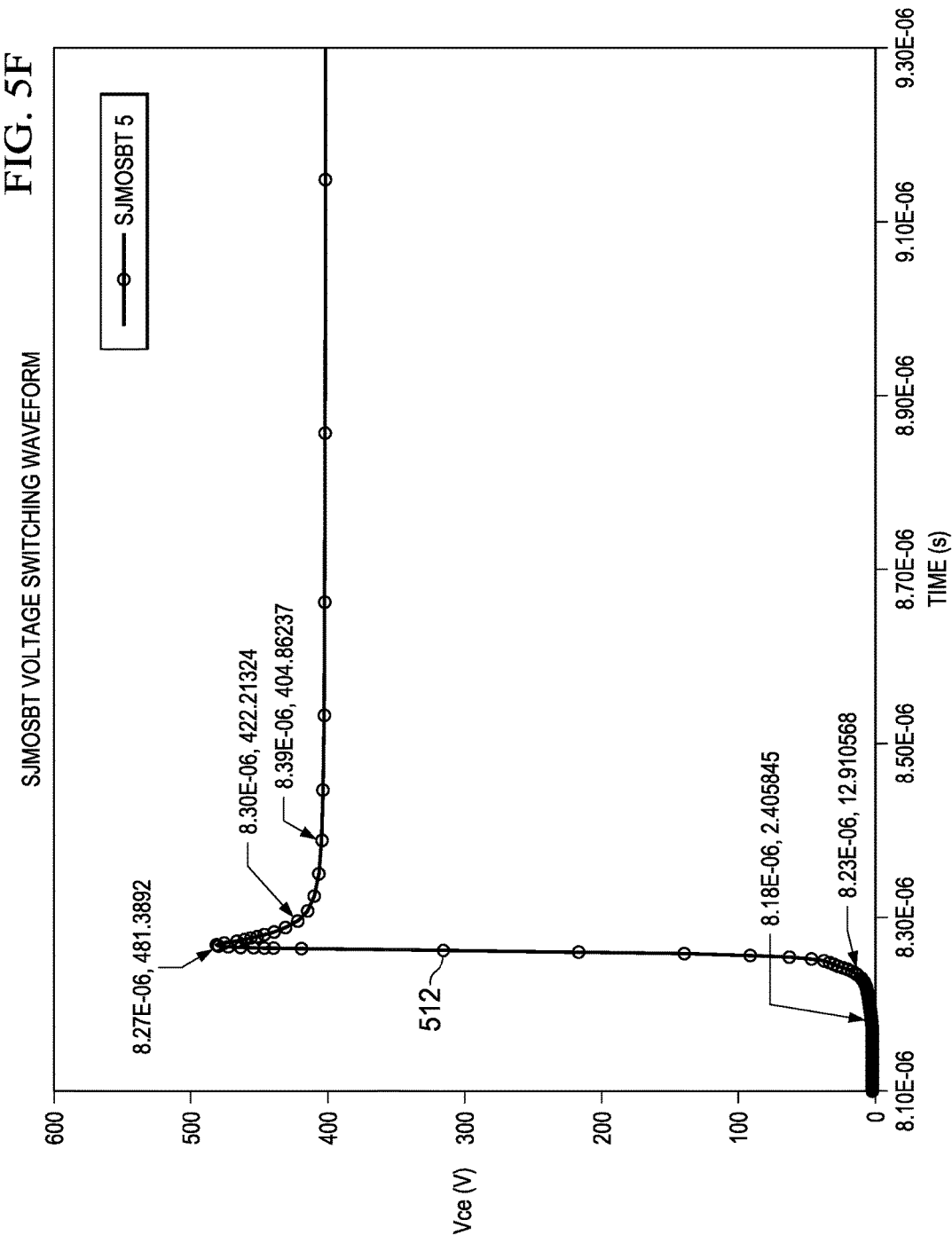
FIG. 5F is a plot that illustrates voltage switching waveforms for a fifth SJMOSBT design variation.

Referring then to FIG. 5F, curve 512 shows a voltage switching waveform for a fifth SJMOSBT. The device begins to turn on at about 8.18 microseconds at about 2.41 volts, begins to ramp vertically at about 8.23 microseconds at about 12.91 volts, overshoots at about 8.27 microseconds to about 481.39 volts, begins to ramp horizontally at about 8.30 microseconds at about 422.21 volts, and settles at about 8.39 microseconds at about 404.86 volts with each value being selected from a range of plus or minus 10 percent that is based on the geometry of the device and which is a clear improvement over the switching time of the IGBT of curve 502 of FIG. 5A.

Referring to FIG. 6, chart 600 shows the power loss for the IGBT described in FIG. 3 and for SJMOSBT 1, SJMOSBT 2, SJMOSBT 3, SJMOSBT 4, and SJMOSBT 5 described in FIG. 3. Table 5 below shows the percent reduction in energy loss of the SJMOSBTs compared to that of the IGBT.

TABLE 5

| | Switching energy loss in millijoules (mJ) | Percent reduction |
| --- | --- | --- |
| IGBT | 3.301 | 0.000% |
| SJMOSBT1 | 0.299 | 90.937% |
| SJMOSBT2 | 0.295 | 91.050% |
| SJMOSBT3 | 0.292 | 91.140% |
| SJMOSBT4 | 0.341 | 89.671% |
| SJMOSBT5 | 0.532 | 83.874% |

Chart 600 describes the switch energy loss calculated from the switching waveforms in FIGS. 4A-4F and 5A-5F. The SJMOSBTs reduce lost energy from the IGBT by about 80 to 90 percent.

Referring to FIG. 7A, process 700 creates vertical semiconductor device 100 from wafer 102.

At optional step 701, characteristics for vertical semiconductor device 100 are selected. In a preferred embodiment, the collector doping level, depth 152 into backside 106, gap width 150, collector doping, and doping level within the N+drain gap are chosen in order to minimize the switching loss energy of the composite device. In a preferred embodiment, the current density level for transition between unipolar conduction to bipolar conduction, the wafer doping level, the collector doping level, depth 152 into the backside, gap width 150 and doping level within the N+drain gap are chosen to simultaneously provide a low switching loss energy, high switching speed, and a low $R_{ds}(on)$ at low current density in unipolar conduction mode as compared to a similarly sized device which is capable of only bipolar conduction at both low and high current densities, such as an IGBT that does not include the N+drain gap.

At step 702, wafer 102 is processed to form P+column 110 and N–column 112. In one preferred embodiment, alternating columns of p-type and n-type doping are created using multiple epi depositions with intervening masked implants. In another preferred embodiment, alternating columns of p-type and n-type doping are created using a deep trench etch and selectively-deposited epi trench refill, or refill with an insulator, or cover the trench opening with an insulating layer before refilling the remainder with polysilicon.

At step 703, topside 104 is processed. In one preferred embodiment, the MOSFET of vertical semiconductor device 100 is constructed using a planar gate on topside 104. In another preferred embodiment, the MOSFET of vertical semiconductor device 100 is constructed using a trench gate.

At optional step 704, if the device characteristics were not previously selected in step 701, then the device characteristics are selected. It is possible with this device and process to defer selection of the device characteristics (i.e., the degree of SJMOS vs. IGBT behavior, which is controlled by gap width, number of gaps, total gap width, collector depth, and doping levels for the gaps and collector) until after the topside processing is completed. The SJMOS on the topside is not modified by adding the drain gaps to the backside collector so that only the backside of the wafer need be processed to control the SJMOS vs. IGBT behavior of a device.

At step 705, backside 106 is processed. In a preferred embodiment, N-type field stop 138 is created using a hydrogen implant or phosphorus implant or other n-type doping methods. In a preferred embodiment, the collectors are created in backside 106 using one or more of photolithographic masking, high-energy implants, and laser annealing.

Referring to FIG. 7B, a preferred embodiment of wafer processing step 702 is further described. Processing step 702 creates N–column 112 and P+column 110 in vertical semiconductor device 100. N–column 112 has near the high $10^{15}$-level atoms/cm$^3$ doping near its center, then doping falls of laterally due to outdiffusion from the P+column 110 p-type doping.

At step 721, an initial epitaxial ("Epi") layer is created. In a preferred embodiment, the initial epitaxial layer includes what will become N–drift region 154 and has a homogeneous doping level of mid $10^{14}$ atoms/cm$^3$ n-type.

At step 722, an additional Epi layer is created. The additional Epi layer is a higher doped n-type Epi layer with relatively homogeneous high $10^{15}$-level atoms/cm$^3$ doping as compared to the initial Epi layer.

At step 723, the topside of the additional Epi layer is patterned with an implant mask. The implant mask includes one or more holes that allow for implantation of doping impurities into the additional Epi layer.

At step 724, doping is implanted through the implant mask. In a preferred embodiment, the implanted doping is p-type impurities with relatively homogeneous high $10^{15}$-level atoms/cm$^3$. At step 726 process 702 ends.

Referring to FIG. 7C, a preferred embodiment of topside processing step 703 is further described. Processing step 703 creates source portions 118, 123, 125 and 130, oxide portions 117, 121, and 129, and gate portions 116, 120 and 128 in vertical semiconductor device 100.

At step 731, material that forms oxide portions 117, 121 and 129 is grown on topside 104.

At step 732, material that forms gate portions 116, 120 and 128 are deposited on top of oxide portions 117, 121, and 129. In a preferred embodiment, a continuous gate layer is applied to a previously grown or deposited oxide layer and the extraneous gate and oxide material that are not required are removed by etching. In another preferred embodiment, the gate is created as a trench gate.

At step 733, the body, body contact, and source dopings for vertical semiconductor device 100 are implanted into topside 104 of wafer 102. In a preferred embodiment, doping is performed with n-type impurities that are implanted into P+column 110 at topside 104 utilizing photolithographic processes.

Referring to FIG. 7D, a preferred embodiment of backside processing step 705 is further described.

At step 741, the N–type field stop is blanket implanted into the backside.

At step 742, the backside is patterned with a mask for the P+collector.

At step 743, the backside is implanted with a chain of KeV or MeV (or both) p-type implants to form the deeply extended P+collector.

At step 744, a contact implant for the N+drain gap is blanket implanted into the backside. The dose for the contact implant is selected to be less than the P+collector contact implant so that the it does not invert the P+collector contact.

At step 745, the backside implants are annealed using either low-temperature furnace or, preferably, using laser annealing.

At step 746, the blanket backside metallization is deposited for making simultaneous contact to the N+drain gap and P+collector regions.

It will be appreciated by those skilled in the art that modifications can be made to the embodiments disclosed and remain within the inventive concept. Therefore, this invention is not limited to the specific embodiments disclosed but is intended to cover changes within the scope and spirit of the claims.

The invention claimed is:

1. A super junction metal oxide semiconductor bipolar transistor comprising:
   a source terminal;
   a gate terminal;
   a source portion connected to the source terminal;
   a body contact portion adjacent the source terminal;
   an extended p-column beneath the body contact portion;
   a first n-column adjacent a first side of the extended p-column;
   a second n-column adjacent a second side of the extended p-column;
   an n-drift region beneath the extended p-column, the first n-column and the second n-column;
   an n-type field stop layer beneath the n-drift region;
   a P+collector layer beneath the n-type field stop;
   an N+drain gap in the P+collector layer;
   a drain contact beneath the N+drain gap; and,
   whereby the N+drain gap enables low $R_{ds}$(on) unipolar conduction at a low current density and bipolar conduction at a high current density.

2. The super junction metal oxide semiconductor bipolar transistor of claim 1 wherein:
   the extended p-column has a doping of about $7 \times 10^{15}$ atoms/cm$^3$;
   the first n-column and the second n-column having dopings of about $7 \times 10^{15}$ atoms/cm$^3$; and,
   the n-drift region has a doping of about $7 \times 10^{14}$ atoms/cm$^3$.

3. The super junction metal oxide semiconductor bipolar transistor of claim 2 wherein the n-type field stop layer has a doping of between about $10^{15}$ and about $10^{17}$ atoms/cm$^3$.

4. The super junction metal oxide semiconductor bipolar transistor of claim 3 wherein:
the P+collector has a doping of between about $10^{17}$ and about $10^{19}$ atoms/cm$^3$; and,
the N+drain gap has a doping of between about $10^{14}$ and about $10^{16}$ atoms/cm$^3$.

5. The super junction metal oxide semiconductor bipolar transistor of claim 2 wherein the N+drain gap is positioned beneath the second N-column.

6. The super junction metal oxide semiconductor bipolar transistor of claim 1 wherein the extend p-column has a depth of between about 35 μm to about 45 μm and a width of about 3 μm.

7. The super junction metal oxide semiconductor bipolar transistor of claim 6 wherein the N+drain gap within about 1 to 2 μm of the n-type field stop layer has a doping of between about $10^{14}$ and about $10^{17}$ atoms/cm$^3$.

8. The super junction metal oxide semiconductor bipolar transistor of claim 1 wherein the N-drift region depth of between about 4 μm and about 10 μm.

9. The super junction metal oxide semiconductor bipolar transistor of claim 1 wherein the n-type field stop has a depth of about 2.5 μm.

10. The super junction metal oxide semiconductor bipolar transistor of claim 1 wherein the P+collector layer has a depth of between about 0.1 μm and about 5 μm.

11. The super junction metal oxide semiconductor bipolar transistor of claim 1 wherein the N+drain gap has a depth of between about 1 μm and about 5 μm and has a width of between about 0.5 μm to about 8 μm.

12. A super junction metal oxide semiconductor bipolar transistor comprising:
a set of source portions;
a set of body contact portions, each body contact portion of the set of body contact portions adjacent a corresponding source portion of the set of source portions;
a set of extended p-columns, each P-column of the set of P-columns beneath a corresponding body contact portion of the set of body contact portions;
a set of N-columns, each N-column of the set of N-columns adjacent one extended P-column of that set of extended P-columns;
an N-drift region beneath the set of extended P-columns and the set of N columns;
an N-type field stop layer beneath the N-drift region;
a P+collector layer beneath the N-drift region;
a set of N+drain gaps in the P+collector layer; and,
whereby the set of N+drain gaps enable a transition of unipolar conduction to bipolar conduction at a predetermined current density.

13. A super junction metal oxide semiconductor bipolar transistor of claim 12 wherein one N+drain gap of the set of N+drain gaps is positioned beneath one N-column of the set of N-columns.

14. A super junction metal oxide semiconductor bipolar transistor of claim 12 wherein one drain gap of the set of drain gaps is positioned beneath every other N-column of the set of N-columns.

15. A super junction metal oxide semiconductor bipolar transistor of claim 12 wherein one drain gap of the set of drain gaps is positioned beneath every tenth N-column of the set of N-columns.

16. A vertical semiconductor device comprising:
a top surface;
a bottom surface;
a super junction metal oxide semiconductor field effect transistor (SJMOSFET) in the top surface;
a P+collector region formed in the bottom surface;
an N+field stop region adjacent the P+collector region;
a plurality of N+drain gaps, in the P+collector region; and,
whereby the plurality of N+drain gaps enables unipolar conduction at a low current density and bipolar conduction at a high current density.

* * * * *